US012770668B2

(12) United States Patent
Villa et al.

(10) Patent No.: US 12,770,668 B2
(45) Date of Patent: Oct. 20, 2026

(54) CELL OPERATION CIRCUIT AND MEMORY DEVICE

(71) Applicant: Ferroelectric Memory GmbH, Dresden (DE)

(72) Inventors: Corrado Villa, Sovico (IT); Alessandro Palludo, Milan (IT); Luigi Paone, Pioltello (IT)

(73) Assignee: Ferroelectric Memory GmbH, Dresden (DE)

( * ) Notice: Subject to any disclaimer, the term of this patent is extended or adjusted under 35 U.S.C. 154(b) by 104 days.

(21) Appl. No.: 18/985,930

(22) Filed: Dec. 18, 2024

(65) Prior Publication Data

US 2026/0171134 A1 Jun. 18, 2026

(51) Int. Cl.
*G11C 11/22* (2006.01)

(52) U.S. Cl.
CPC ........ *G11C 11/2273* (2013.01); *G11C 11/221* (2013.01)

(58) Field of Classification Search
CPC .......................... G11C 11/2273; G11C 11/221
USPC .................................................. 365/145, 205
See application file for complete search history.

(56) References Cited

U.S. PATENT DOCUMENTS

| | | | | |
|---|---|---|---|---|
| 10,546,629 | B1 * | 1/2020 | Vimercati | G11C 11/2275 |
| 10,706,911 | B1 * | 7/2020 | Seo | G11C 11/4091 |
| 2020/0013459 | A1 * | 1/2020 | Do | G11C 13/004 |
| 2020/0105315 | A1 * | 4/2020 | Chang | G11C 13/0061 |
| 2020/0402563 | A1 * | 12/2020 | Guo | G11C 11/2273 |
| 2021/0020236 | A1 * | 1/2021 | Baek | G11C 13/0069 |
| 2021/0193238 | A1 * | 6/2021 | Chai | G11C 16/3459 |
| 2021/0257018 | A1 * | 8/2021 | Choi | G11C 16/0483 |
| 2023/0011345 | A1 * | 1/2023 | Carman | G11C 11/221 |

FOREIGN PATENT DOCUMENTS

| | | | | |
|---|---|---|---|---|
| CN | 110838309 A | * | 2/2020 | G11C 7/08 |
| KR | 20210082847 A | * | 7/2021 | G09G 3/3208 |

* cited by examiner

*Primary Examiner* — Michael T Tran
(74) *Attorney, Agent, or Firm* — Natalie Albrecht

(57) ABSTRACT

Disclosed herein is a cell operation circuit for sensing a programmed state of a memory element comprising: a sensing circuitry comprising a sensing node, a first input terminal to receive a first operation voltage and a second input terminal to receive a second operation voltage less than the first operation voltage; a first switch configured to apply a pre-charge voltage less than the second operation voltage to the sensing node; wherein the sensing circuitry is configured to read from the memory element based on a sensing voltage, which is developed at the sensing node.

20 Claims, 7 Drawing Sheets

FMC_105

CELL OPERATION CIRCUIT AND MEMORY DEVICE

TECHNICAL FIELD

This disclosure relates to implementations for the operation of non-volatile memories, and in particular, of memories that include state-programmable memory elements for storing information in a memory cell.

BACKGROUND

Non-volatile memories allow for storing information in a memory, where the stored information is retained in the memory even after external power to the memory has been removed. Memories are typically formed from a number of memory cells, where each memory cell is able to store information in a state-programmable memory element (e.g., a ferroelectric memory element such as a ferroelectric capacitor) that is capable of retaining the written information based on a programmed state of the state-programmable memory element that is retained even after its power source has been removed. The programmed state usually represents a binary value (e.g., a logic "1" or a logic "0") that may be read out at later time by applying a read voltage sufficient to switch the state of the state-programmable memory element, and then determining the read state from the switching charge injected when the state-programmable memory element changes states. However, conventional configurations suffer from various deficiencies, leading to potential read errors.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
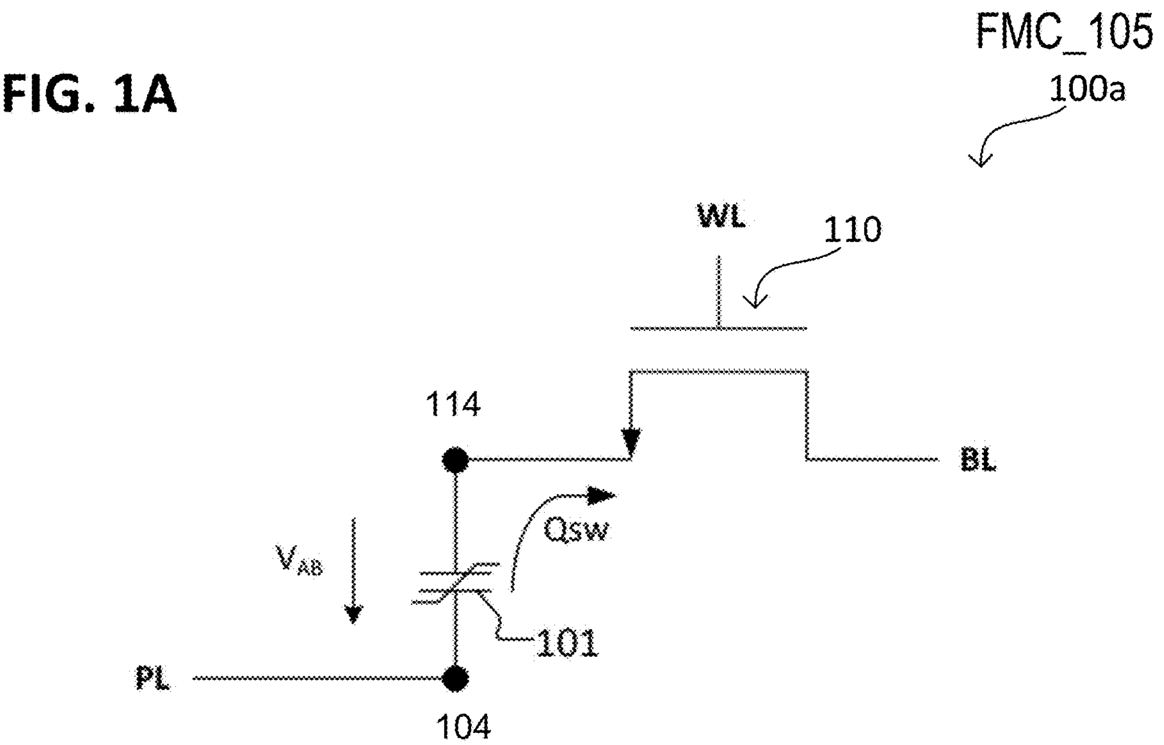
FIG. 1A shows an exemplary memory cell including a state-programmable memory element and FIG. 1B shows a graph of an exemplary hysteresis curve of such a state-programmable memory element indicating threshold voltages and logic states.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices. However, it may be understood that aspects described in connection with methods may similarly apply to the devices, and vice versa.

In general, the term "bit" (also referred to as digital bit or as binary digit) relates to the fundamental unit of information storage, transmission and processing. The value of a bit represents a logical state selected from only two logical states, which are commonly referred to as "0" or "1", or as "on" and "off". In context of information storage, each of these logical states may be represented by a physical state (also referred to as programmed state or memory state) of a state-programmable memory element, e.g., the polarization direction of the memory element.

The term "switch" (also referred to as switch circuitry) relates to a circuitry including two terminals and a connection between the two terminals. The switch is configured to change an impedance (e.g., resistance) of the connection, e.g., in a controlled manner and/or as a function of a signal (e.g., control signal) to which the switch (e.g., a control terminal thereof) is exposed. For example, the impedance (e.g., resistance) of the connection may be decreased, when the voltage of the control signal increases, and increased otherwise. Herein, the switch is implemented by one or more transistors (e.g., a gate terminal being supplied with the control signal), which is understood as not limiting. The references made hereto may apply in analogy to any other implementation of the switch.

In general, a non-volatile memory device is typically formed from a number of memory cells, where each memory cell typically stores one of two (e.g., logical) states: a first state representing the off state (e.g., representing a digital bit of "0") and a second state representing the on state (e.g., representing a digital bit of "1"). The individual memory cells of the memory are typically organized into control groupings of cells (also referred to as set), where each cell may be individually addressed but have a common operation scheme for biasing the cells via control lines such as bitlines (e.g., for operating the cells grouped in the same column), wordlines (e.g., for operating cells grouped in the same row), and/or platelines (e.g., for operating cells grouped so as to share a common node such as a same "plate"). Among other components, a memory cell may include a state-programmable memory element (e.g., a ferroelectric memory element such as a ferroelectric capacitor) that is capable of retaining the written information by writing one of the remanent states of the memory element so that it may be read out at a later time during a read operation.

As used throughout this disclosure, a state of a memory element is described as "remanent" where the memory element is capable of retaining its programmed state even when it is not connected to a power source. As also used throughout, the current remanent state to which the memory element has been set may be referred to as the "stored" state, the "written" state, or the "programmed" state. As should be understood, when referring to a state-programmable memory element, the terms "write," "store," or "program" are used generically to refer to setting the remanent state of the state-programmable memory element(s). As is understood, the term "voltage" (also referred to as electrical potential difference), e.g., with respect to "a bitline voltage", "a wordline voltage," "a plateline voltage," and the like, may refer to an electrical potential, e.g., its value with respect to a reference operation voltage (e.g., ground). The "voltage across" a component may be used herein to denote a voltage drop from a node on one side of a component (e.g. one side of a capacitor) to a node on the other side of the component (e.g., the other side of the capacitor).

When a state-programmable memory element includes ferroelectric material (e.g., a ferroelectric capacitor), the remanent state is understood as referring to a remanent polarization state that is set by applying a particular voltage across the element that is sufficient to set a corresponding polarization state, where, once set, the remanent polarization state is retained by the element even when the voltage across the element has been removed (e.g., it is remanently-polarizable). Once such an element has been state-programmed to a remanent state, it generally retains the programmed state until it is re-programmed by applying a voltage across it that is sufficient to program the element to a (e.g., new) remanent state. A polarization capability of a state-programmable memory element (e.g., remanent polarization capability, e.g., non-remanent spontaneous polarization capability) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

As noted above, a memory device (shortly also referred to as memory) includes multiple memory cells, of which each memory cell contains a memory element that represents information by being programmable to different states, each state corresponding to different stored information (e.g., a stored value of a digital bit of "0" may be represented by a first programming state and a digital bit of "1" may be represented by a second programming state). Once the memory element of the memory cell has been programmed (also referred to as write operation), the programmed state may be read out (also referred to as read operation) by initiating a read operation mode. In the read operation mode, a read voltage may be applied to the memory element that is sufficient to switch its programmed state and develop a charge (also referred to as switching charge) in a cell operation circuit, a sensed voltage of which may then be compared to a threshold reference voltage to determine the programmed state (also referred to as memory state).

A cell operation circuit may include or may be implemented by a sense circuit, e.g., a sense amplifier as sense circuit, to which this disclosure refers to without limitation thereof. It may be understood that all other architectures of cell operation circuits (also referred to as sensing architectures) may be used, to which the references made herein apply in analogy. Various implementations of a cell operation circuit, e.g., the sense amplifier thereof, are configured to amplify a voltage swing initiated by the switching charge to a certain level, which can be interpreted properly by a circuit outside the memory. For example, the sense amplifier may be implemented by a latch, which is described later in detail.

With certain memory cell configurations, sensing architectures, and memory elements, there may be a parasitic coupling between the bitlines and the plateline, and thus a parasitic coupling across each state-programmable memory element (e.g., where one terminal is connected to the bitline, typically through an access transistor, and the other terminal is connected to the plateline). Thus, when the plateline is charged, the parasitic coupling may develop a parasitic voltage at one or more bitlines through the respective memory elements. A higher level of the parasitic voltage reduces the width of the read window (e.g., the difference between the developed voltage associated with a "0" bit and the developed voltage associated with a "1" bit) and the read margin may be reduced, leading to potential read errors.

As example, the parasitic voltage developed on the bitline due to the parasitic coupling may influence the cell operation circuit, which is configured, in a read operation mode, to read (e.g., the memory state) from the memory cell. When the parasitic voltage exceeds a certain threshold, the cell operation circuit may read a logical 1, irrespective of the actual memory state of the memory cell. This may lead to the risk of a reading error, which increases with the number of memory cells having the same memory state.

This parasitic coupling may particularly exist in a memory with an "all bitline" (ABL) architecture, where multiple (e.g., all) bitlines in a group may be read simultaneously by applying a read voltage to a plateline that is common to the group and then sensing the charge developed on each memory element's corresponding bitline, meaning that all bitlines of the group may contribute to the parasitic voltage when being read out simultaneously.

Figure 1B:
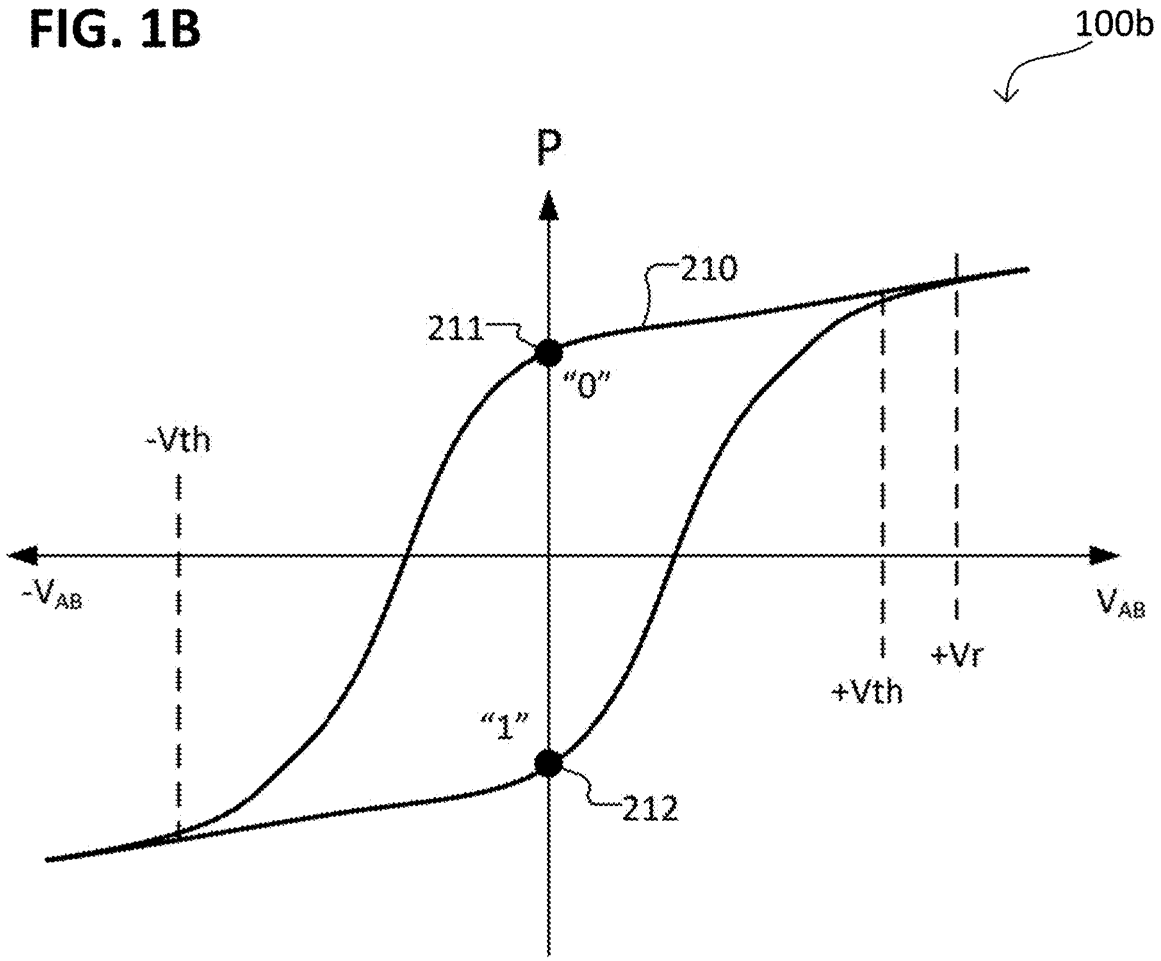

FIG. 1A shows an exemplary memory cell 100*a* including a state-programmable memory element 101 and an access switch 110 provided by a transistor (also referred as to access transistor); and FIG. 1B shows a diagram 100*b* of an exemplary hysteresis curve 210 of such a state-programmable memory element 101. The memory element 101 includes a first terminal 114 (also referred to as bitline terminal), which is configured to be connected to the bitline (BL) of the memory through the access transistor as access switch 110. The memory element 101 includes further a second terminal 104 (also referred to as plateline terminal), which is configured to be connected to the plateline (PL) of the memory. The access transistor may be configured to be controlled by a wordline (WL) of the memory, e.g., as the gate of the access transistor is exposed to a voltage of the wordline, WL. The figure illustrates the connection of the memory element 101 to the plateline PL and bitline BL, with the access transistor acting as a switch controlled by the wordline WL. When the access transistor is active, it allows the switching charge Qsw to be developed onto the bitline BL, causing a voltage swing at the bitline BL, which is indicative of the programmed state of the memory element 101.

An exemplary implementation of a read operation includes, in a first phase (also referred as to pre-charge phase), to pre-charge (e.g., discharge) the bitline BL (e.g., to a first pre-charge voltage CP) and then increase the voltage of the PL terminal to a plate voltage, $V_{PL}$, as read voltage at which a switching charge Qsw is provided from the state-programmable memory element to the bitline terminal 114. As example, the read voltage, $V_{PL}$, may be configured in accordance with the following relation: $V_{PL}-CP \geq Vr$.

If the access transistor is active, the switching charge Qsw is developed onto the bitline BL, thereby causing a voltage swing (also referred to as switching voltage) at the bitline BL, which is a function of the programmed state of the state-programmable memory element 101 and its dielectric capacitance. The developed switching voltage may be processed by a sensing circuitry, which is coupled to BL. For example, the switching voltage is compared to a predetermined threshold voltage to determine the read state (e.g., the logic state, e.g., a "0" or a "1") of the corresponding memory cell.

FIG. 1B shows a schematic diagram 100*b* of an exemplary hysteresis curve 210 of a state-programmable memory element (e.g., the state-programmable memory element 101 of FIG. 1), where the polarization (P) of the state-programmable memory element is plotted as a function of the voltage applied across it ($V_{AB}$). In the case of the memory cell shown in FIG. 1A, the voltage applied across the state-programmable memory element is the difference in voltage between the plateline terminal 104 and the bitline terminal 114, e.g., expressed as a function of $V_{PL}$–$V_{BL}$. Diagram 100*b* shows two remanent polarization states (211, 212) of the state-programmable memory element that may represent the programmable states of the memory element. For example, the state-programmable memory element may be programmed to remanent polarization state 211 (representing, for example, a bit of digital information with a value of "0") or to remanent polarization state 212 (representing, for example, a bit of digital information with a value of "1") by applying a programming voltage across the state-programmable memory element that is sufficient to program the corresponding remanent polarization state.

The programming voltage is defined by a (e.g., intrinsic) threshold voltage (Vth) of the state-programmable memory element (e.g., above its coercive voltage), above which the state-programmable memory element is programmed to a corresponding remanent polarization state. For example, if the applied voltage across the state-programmable memory element is greater than +Vth (e.g., more positive than +Vth), the state-programmable memory element will be programmed to remanent polarization state 211. If the applied voltage across the state-programmable memory element is greater than −Vth (e.g., more negative than −Vth), the state-programmable memory element will be programmed to remanent polarization state 212. The hysteresis curve 210 shows the path the polarization follows as the voltage across the state-programmable memory element changes.

To read the stored state (also referred to as programmed state) of a state programmable memory element, a read voltage (e.g., +Vr being a function of $V_{PL}$) is applied across the state-programmable memory element that is sufficient to program a remanent state of the state-programmable memory element to a predefined state. This develops the switching charge, which is a function of the programmed state before the read voltage was applied. In the first case, when the read voltage causes the state-programmable memory element to switch to a new state (e.g., the predefined state is different from the previously programmed state), the switching charge will be larger compared to the second case, when the read operation caused the state-programmable memory element to be re-programmed to the same state (e.g., the predefined state is the same as the previously programmed state). For example, in the second case, little or no switching charge will be provided from the state-programmable memory element.

To facilitate the understanding, the predefined state is assumed to be "0" herein, which is not limiting. The references made thereto apply analogously for a configuration, in which the predefined state is to be "1".

As should be understood, the voltage of the bitline BL may also be a function of one or more parasitic (e.g., capacitive) couplings, e.g., the intrinsic dielectric capacitance of the state-programmable memory element 101, the capacitance of the conductors to which it is connected (e.g., the bitline), and the capacitive coupling to one or more other bitline BL and/or the plateline PL. As a result, the voltage of the bitline, BL, which is processed by the cell operation circuit during a read operation, may depend not only on the switching charge but also on such capacitive couplings, the voltage level of the plateline and vice versa.

Aspects provided herein address the parasitic capacitance (also referred as to BL parasitic capacitance) between the bitline, BL, and a reference node, to which a reference operation voltage (also referred as to second operation voltage) is applied.

To facilitate understanding, the reference operation voltage is herein represented by electrical ground (GND). The references made thereto may be understood as not limiting and to apply in analogy to any other reference operation voltage, which may be different from ground, such as a virtual ground, a negative voltage, a variable reference operation voltage or the like.

Aspects herein are based on the recognition that a conventional cell operation schema, where the BL is grounded before the cell selection and before the plate voltage is raised to bias the cell capacitor, are unsatisfactory. In detail, it was recognized that cell capacitance of the memory element 101 is in series with the BL parasitic capacitance. This facilitates a charge sharing between the cell capacitance and the BL parasitic capacitance, thereby altering the voltage, $V_{BL}$, of the bitline, BL. The net voltage across the cell cap capacitance is reduced to the difference between $V_{PL}$ and the altered voltage of the bitline, BL. Various aspects provided herein compensate this effect by applying a pre-charge voltage, CP, to the bitline, BL, to offset the voltage of the bitline, BL, e.g., before the plate voltage is raised to $V_{PL}$ to bias the memory element 101. This results in net voltage across the cell cap capacitance being a function of $V_{PL}$ and the pre-charge voltage, CP, and facilitates to exceed the coercive voltage of the memory element 101, without requiring adaptions to $V_{PL}$. Otherwise increasing $V_{PL}$ might require an additional charge pump, which is undesirable from a power and a cost perspective.

Figure 2A:
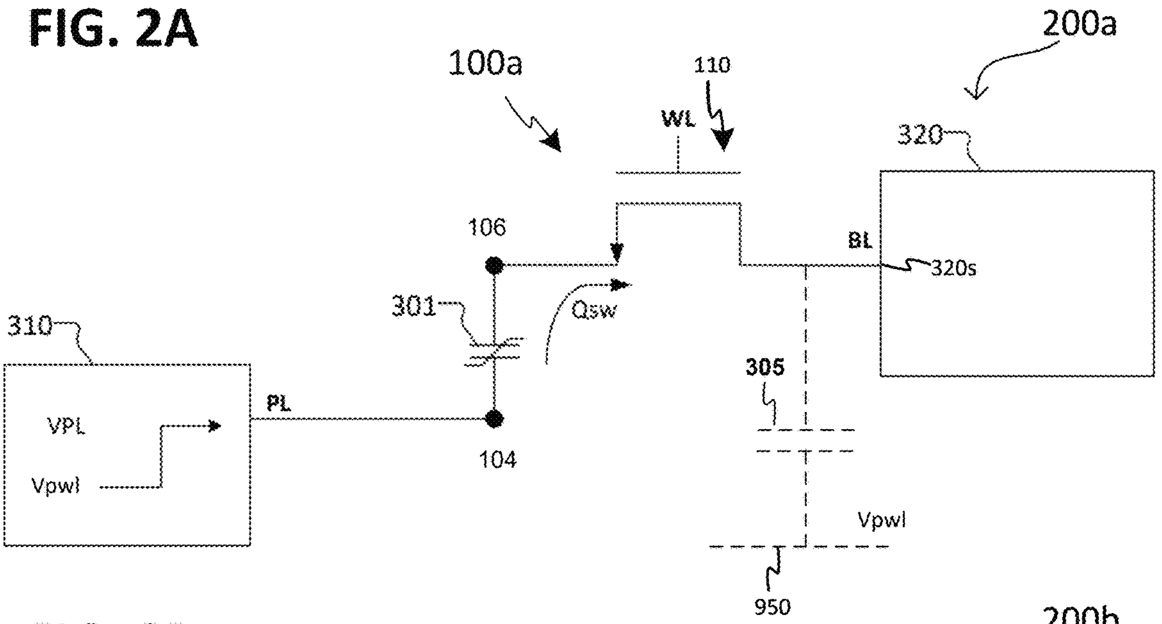
FIG. 2A to FIG. 2C show each a device in a schematic circuit diagram.

FIG. 2A shows a device 200*a* (e.g., memory device) in a schematic circuit diagram illustrating the BL parasitic capacitance 305 between the bitline, BL, and the reference node 950, to which GND is applied as exemplarily reference operation voltage, Vpwl. The BL parasitic capacitance 305 may result from a parasitic coupling between the bitline, BL, and the reference node 950. Device 200*a* includes the memory cell 100*a*, a cell operation circuit 320, the bitline, BL, and a plateline voltage control circuitry 310, coupled to the plateline, PL. The state-programmable memory element 301 connects to the bitline, BL, via an access switch 110 provided by a transistor (also referred as to access transistor) controlled by the wordline, WL.

The memory cell 100*a* includes the memory element 101 being in series between the bitline, BL, and the access switch 110, which is controlled by the word line, WL. The memory element 101 is coupled via the access switch 110 to the sensing node 320*s* of the cell operation circuit 320, e.g., provided by a sense amplifier 420 as exemplary sensing circuitry thereof (see also FIG. 3A). The memory element 101 is further coupled to the plate line, PL, via the plateline terminal 104 and to the access switch 110 via the bitline terminal 114, which is connected to the sensing node 320*s* via the bit line, BL.

The sensing circuitry is responsible for reading the programmed state of the memory element 101 by sensing the voltage developed at the sensing node 320*s*. The plate line PL is supplied by the plateline voltage control circuitry 310 (also referred as to plate voltage source 310), which provides the plate voltage $V_{PL}$.

In an exemplary read operation, the bitline BL may first be discharged to CP and then a read voltage is applied to the state-programmable memory element 101, e.g., by increasing the voltage of the plateline, PL, e.g., to $+V_{PL}$. The read voltage is sufficient to program the state-programmable memory element 301 to a predefined remanent state (e.g., the state associated with "0," e.g., shown in FIG. 1B as 211). The switching charge (Qsw) is then developed by the programmable memory element 301 through the access transistor to the bitline BL. Additionally, the bitline BL may be influenced via the parasitic capacitance 305.

As should be understood, a single sense amplifier may, for example, be connected to multiple memory elements that are part of the same set and therefore share a common bitline. Alternatively or additionally, a sense amplifier 420 (see also FIG. 3A) may be differential or dual-sided, where one side of the sense amplifier 420 is connected to one bitline of one set of memory cells (e.g., a bitline of an even set of cells) and the other side of the amplifier is connected to a bitline of a different set of memory cells (e.g., a bitline of an odd set of cells). In a dual-sided configuration, one side of the sense amplifier 420 may be actively operated to read a bitline of one set of cells (e.g., the even side) while the other side (its complement) of the amplifier acts as a reference (e.g., a bitline on the odd side), and vice versa.

Figure 2B:
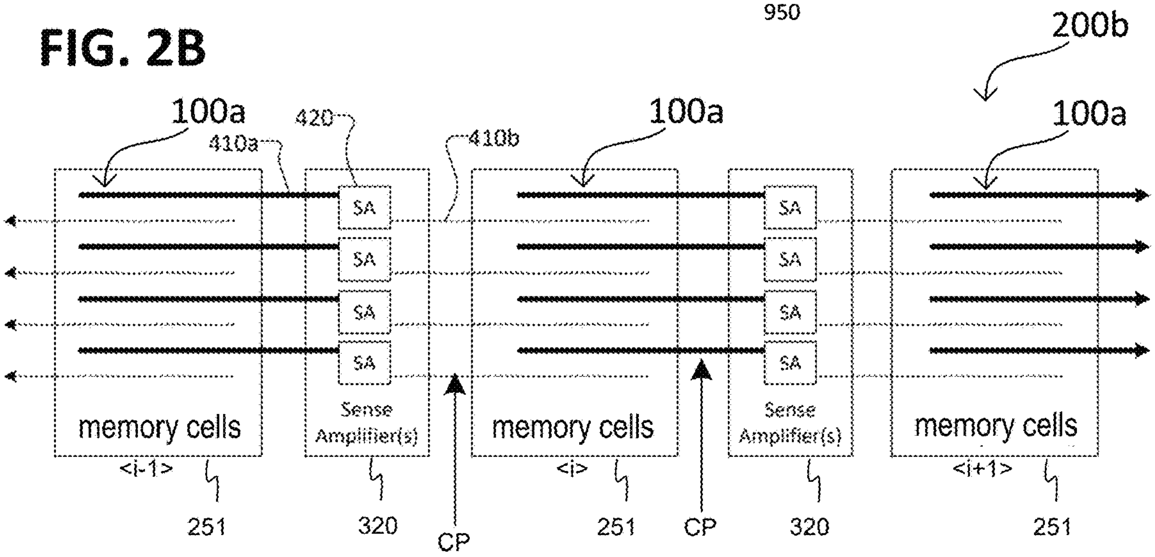

FIG. 2B shows a device 200*b* (e.g., memory device) in a schematic circuit diagram, the device 200*b* including multiple sets 251 of memory cells 100*a*, and multiple cell operation circuits 320 in a complementary configuration (also referred to as dual-sided configuration), of which each cell operation circuit 320 includes a set of sense amplifiers (also referred to as bank) coupled to a bitline, BL. The complementary type uses dual-sided (also called complementary) sense amplifiers as shown in FIG. 2B, where each sense amplifier in a set of sense amplifiers may be connected, on one side of the dual-sided amplifier to a common bitline for one row in an "even" set of memory cells (shown by heavy, dark lines) and on the other side of the dual-sided sense amplifier to a common bitline for one row in an "odd" set of memory cells (shown by light, dotted lines). Illustratively, the light line of a given sense amplifier is complementary to the dark line. In FIG. 2B, eight sense amplifiers are shown in two different banks, where one sense amplifier 420 and its complementary "even" bitline 410*a* connected to one row of an "even" set of memory cells and its "odd" bitline 410*b* connected to one row of an "odd" set of memory cells are labeled. As should be appreciated, this type of pattern may repeat across the memory, where each memory cell array may have any number of rows of "even" sets of memory cells, each with a (e.g., complementary) row in the set of "odd" memory cells, where each sense amplifier connects, differentially, to an even/odd bitline pair. As should be understood, the terms "even" and "odd" are arbitrary groupings of memory cells to which the sense amplifier is connected and need not refer to any particular numbering scheme of even- and odd-numbered cells. More generally, the even/odd configuration or dual-sided configuration described herein may be understood as a complementary configuration, where one side of the amplifier is the side to be read while the other side serves as its complement. In a typical memory that has even and odd groupings of memory cells, the groupings may be, for example, layout-based.

In an exemplary implementation of device 200*b*, each sense amplifier is connected to an odd bitline and an even bitline, and e.g., using the odd bitline as a reference bitline and the even bitline for sensing the memory state (also referred as to targeted bitline). Further, each set 251 of memory cells 100*a* provides a memory cell array referenced by an integer <k> (k=1 to k=K), where K is the number of memory cell arrays. In an exemplary first operation scenario of the device 200*b* of FIG. 2B, the memory cell array <k=i> (depicted in the center) between two operation circuits 320, of which each includes a set of sense amplifiers 420, is determined as the addressed array. Then, both set of bitlines coupled to the addressed array, a first set of bitlines (dark lines) and a second set of bitlines (dashed lines), are used as targeted bitlines, irrespective of the denotation "even" or "odd". Further, the dark bitlines 410*b* coupled to memory cell array <i−1> (leftmost array) and the dashed bit lines 410*b* coupled to the memory cell array <i+1> (rightmost array) are used as reference bitlines.

In an exemplary second operation scenario, memory cell array <i+1> is determined as the addressed array. Then the dark bitlines coupled to memory cell array <i> are used as reference bit lines.

In view thereof, it is understood herein, that the references made herein regarding to the terminology "odd" and "even" and to the exemplary operation scenarios, in which the "odd" side is used as reference (see as example FIG. 3B), may apply in analogy to the operation scenarios, in which the "even" side is used as reference. Terminology referring to "odd" and "even", such as "PRECHO"/"PRECHE", may be understood as referring to a specific set of sense amplifiers, and may, in other scenarios, be vice versa. For example, referring to the exemplary first operation scenario detailed above, the sense amplifiers 420 of the left cell operation circuit 320 use the dark bitlines (e.g., even bitlines/cells) as reference bitlines and the dashed bit lines (e.g., odd bitlines/cells) as targeted bitlines, whereas the sense amplifiers 420 of the right cell operation circuit 320 use the dark bitlines (e.g., even bitlines/cells) as targeted bitlines and the dashed bit lines (e.g., odd bitlines/cells) as reference bitlines.

Considering the left cell operation circuit 320, the first pre-charge voltage CP (e.g., pulse) is applied to the dashed bitlines (e.g., odd bit lines) coupled to the left cell operation circuit 320. Considering the right cell operation circuit 320, the first pre-charge voltage CP (e.g., pulse) is applied to the dark bitlines (e.g., even bitlines). The references made herein (e.g., made to FIG. 3B) are related to the exemplary first operation scenario, and may apply in analogy to other operation scenarios, in which the odd bitlines are used as targeted bitlines and the even bitlines are used as reference bitlines. Thus, it may be understood more generally that the first pre-charge voltage CP is applied to the targeted bitlines.

Figure 2C:
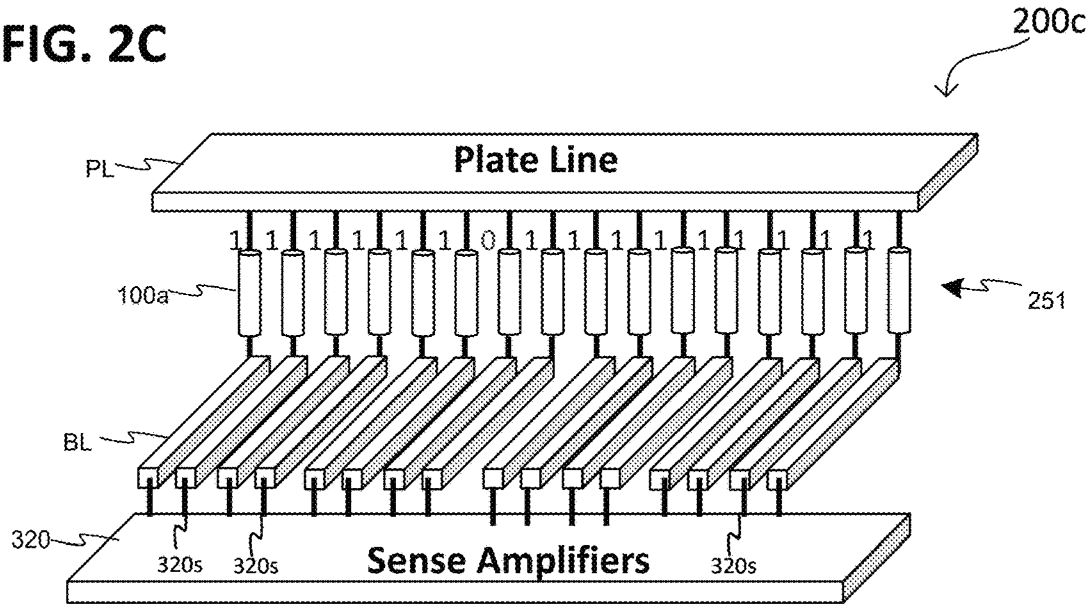

FIG. 2C shows a device 200*c* (e.g., memory device) in a schematic three-dimensional circuit diagram, the device 200*c* including a set 251 of memory cells 100*a* including one or more first memory cells programmed to a first state (e.g., representing a digital bit of "0"), and a plurality of second memory cells, of which each is programmed to a second state (e.g., representing a digital bit of "1"). The set 251 of memory cells 100*a* are arranged as array, with each set being connected to a common plate line PL and multiple bit lines BL. The operation circuit 320 includes a set of sense amplifiers 420 to read the programmed state of the memory cells 100*a* based on the voltages developed at the sensing nodes 320*s*. For example, the memory cells 100*a* are arranged in rows and columns within a memory cell arrays, with each row connected to a common word line WL and each column connected to a common bit line BL.

Figure 3A:
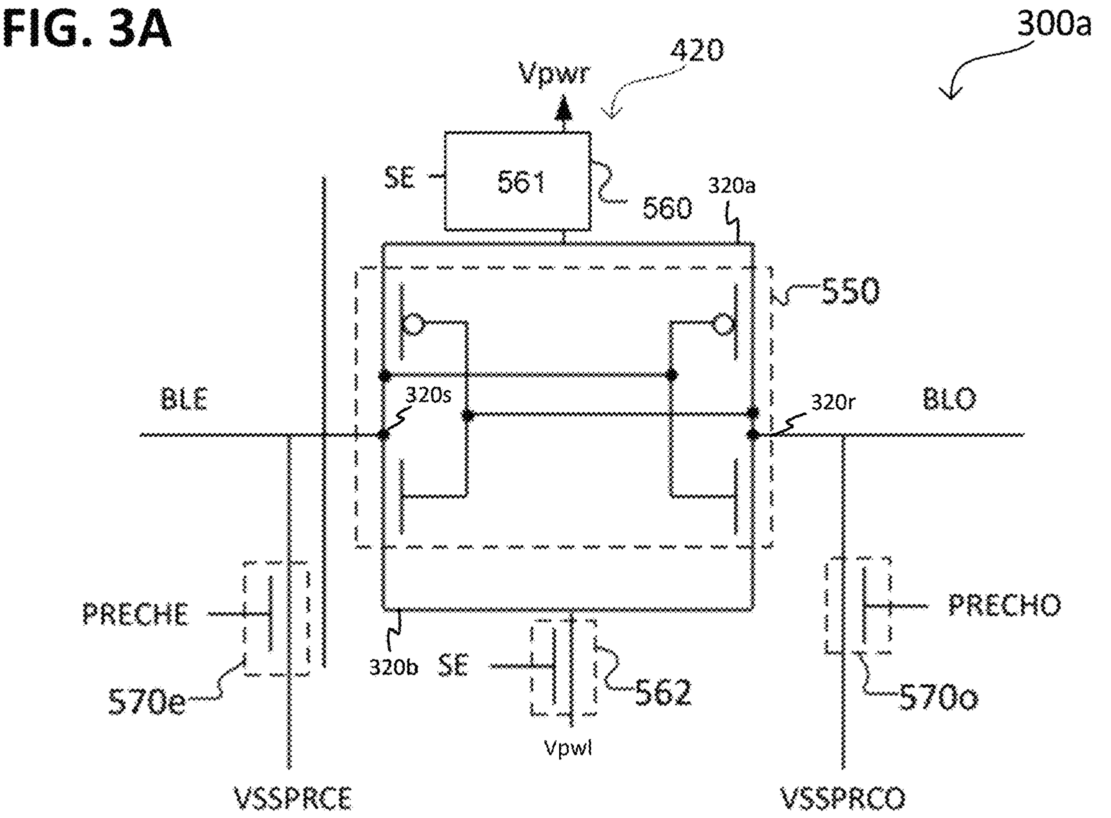
FIG. 3A shows a cell operation circuit in a schematic circuit diagram.

FIG. 3A shows a part of cell operation circuit 320 of a complementary type including a sense amplifier 420 in a schematic circuit diagram 300*a*. In a dual-sided configuration, the sense amplifier may be implemented by a latch 550. The latch 550 of the exemplary dual-sided configuration includes the sensing node 320*s* as first input (e.g., the "even" input) connected to an even bitline (BLE) and a further sensing node 320*r* (also referred as to reference sensing node) as a second input (e.g., the "odd" input) connected to an odd bitline (BLO). As detailed above, the references made hereto are related to the exemplary first operation scenario, and may apply in analogy to other operation scenarios, in which the odd bitlines are used as targeted bitlines, which are exposed to the first pre-charge voltage CP. The latch 550 may be powered via one or more switches 561, 562 (also referred to as circuit operation switches 561, 562), e.g., transistors, of an operation control circuitry 560. The operation control circuitry 560 may be controlled by one or more sense enable (SE) signals provided to or by a control circuitry, as described later in detail.

The circuit operation switches 561, 562, when enabled, connect a first side of the latch 550 to a first operation voltage (also referred as to supply operation voltage), Vpwr, supplied to the first input terminal 320*a*, and a second side of the latch 550 to the reference operation voltage Vpwl (e.g., ground or another reference operation voltage) supplied to a second input terminal 320*b*. The supply operation voltage may be more than the reference operation voltage, e.g., by at least about 1 Volt, e.g., by at least about 2 Volt, e.g., by at least about 3 Volt, e.g., by at least about 4 Volt. When the reference operation voltage is GND, CP may less than GND, e.g., being a negative voltage. As example, CP=−0.3 Volt.

To initiate a read operation mode, the circuit operation switches 561, 562 may be operated by the one or more sense enable (SE) signals to apply the operation voltages, Vpwr and Vpwl, to latch 550, e.g., when the SE signal is enabled. Before and/or after the read operation mode, the circuit operation switches 561, 562 may be operated by the one or more sense enable (SE) signals to leave the latch 550 floating (also referred to as inactive latch 550), when the SE signal is not enabled.

Further, the cell operation circuit 320 may include a first pre-charge control (PRC) switch 570*e*, also referred as to even pre-charging control switch 5700, and a second pre-charge control (PRC) switch, also referred as to odd pre-charging control switch. Even and odd pre-charging control (PRC) switches (570*e*, 570*o*), e.g., implemented by respective transistors (also referred as to PRC transistors), may be operated by corresponding signals (PRECHE, PRECHO) that, when enabled, connect the corresponding bit line to its corresponding even/odd pre-charge signals (VSSPRCE, VSSPRCO) for charging/discharging the corresponding bit line.

As detailed above, the references made to the even/odd pre-charge signals (VSSPRCE, VSSPRCO) are related to exemplary operation scenarios. Generally, the pre-charge signals (VSSPRCE, VSSPRCO) may be provided as global signals, i.e. which are not exclusively assigned to a specific bit line. Each bitline is exposed to either VSSPRCE or VSSPRCO, depending on the operation scenario and on the respective switch(es) activated.

As reflected by the exemplary implementation of FIG. 3A, the PRC transistors as PRC switches 570*e*, 5700 may be individually controlled using their gate control line, thus being exposed to the different PRC (pre charge control) signals, namely PRECHE and PRECHO. Further, the level of each pre-charge voltage (VSSPRCE, VSSPRCO) may be controlled by pre-charge signal control circuitry 882, as detailed later. The pre-charge signals (VSSPRCE, VSSPRCO) may be controlled to be at the first pre-charge voltage (also referred as to compensation voltage), CP, or a second pre-charge voltage, VREF.

Figure 3B:
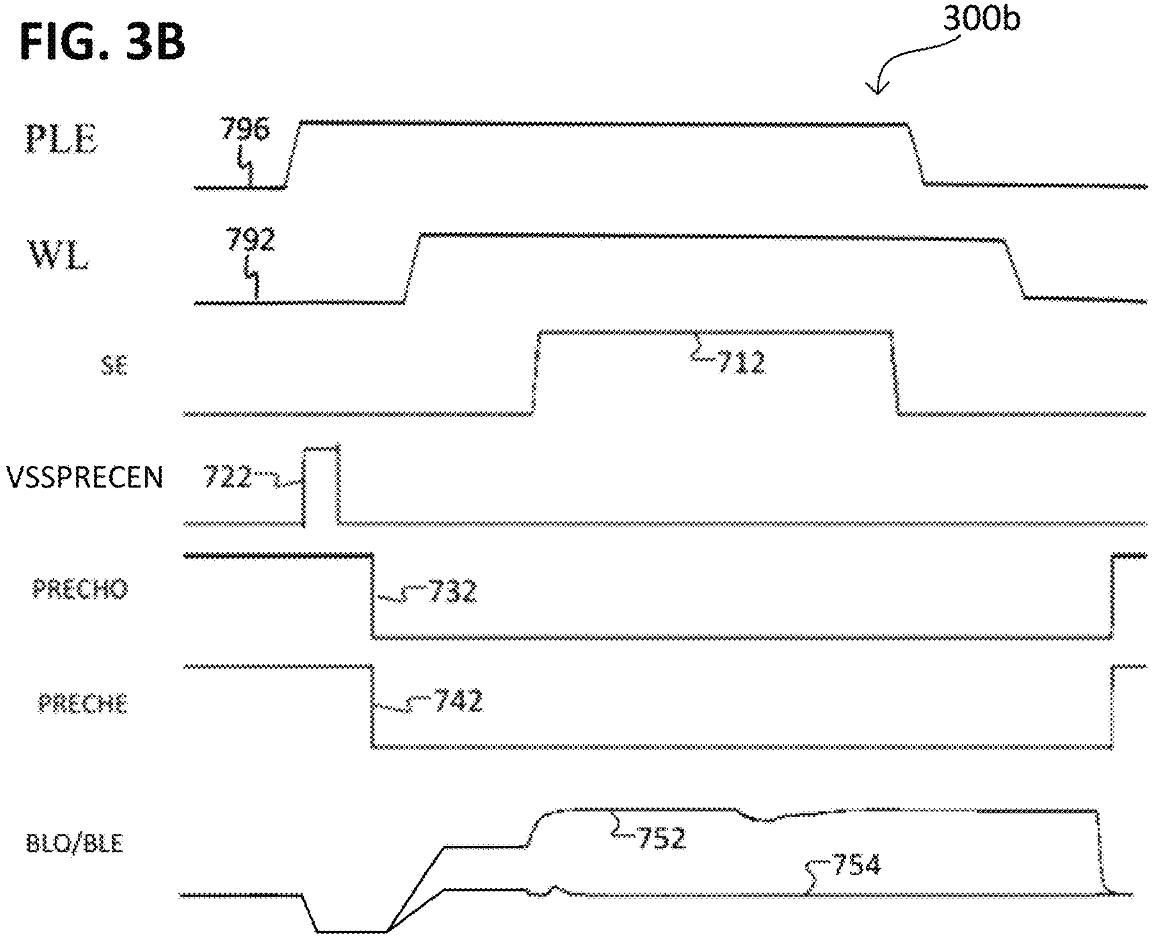
FIG. 3B shows an operation schema in a schematic timing diagram illustrating various operation phases.

FIG. 3B show a read operation in a schematic timing diagram for the cell operation circuit 320 of FIG. 3A or another implementation of cell operation circuit 320 that may be dual-sided, and includes, similar to FIG. 3A, a latch 550.

Starting at the top of the diagram, the first and second segments plot the time dependent voltage levels on the wordline (WL, plotted along line 792), and the plateline (PLE, plotted along line 796). The third segment plots the pre charge control signals, PRECHO, along line 742, and PRECHE, along 732, that, when at logic high, connects the bitlines to VSSPRCE/VSSPRCO, and, when at logic low, leaves the bitlines floating.

The next segments plot the voltage on the targeted bitline, for two cases, of which the upper (along line 752) represents a logic information of "1" (e.g., logic high) and the lower (BLO, along line 754) represents a logic information of "0" (e.g., logic low).

Figure 4:
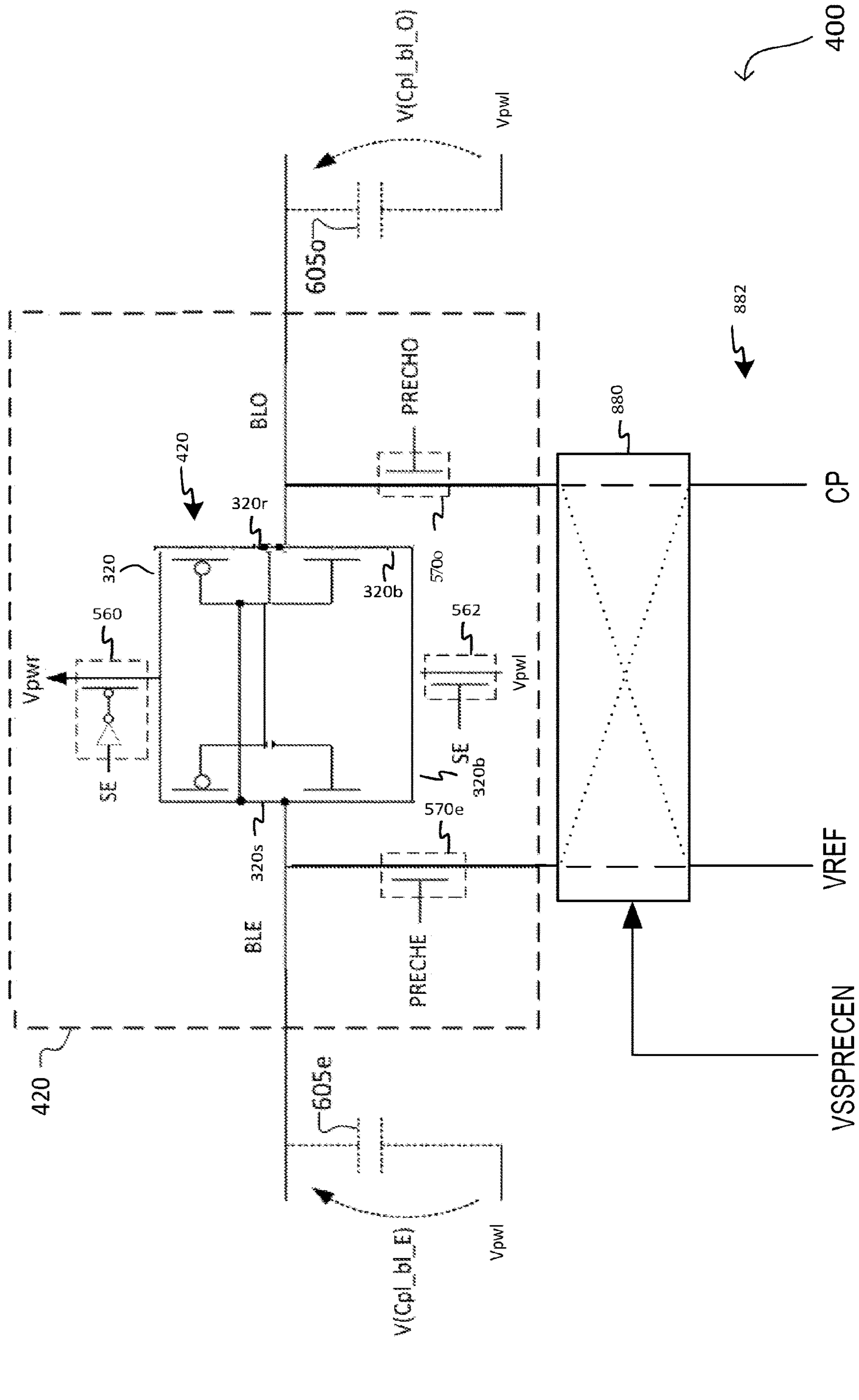
FIG. 4 and FIG. 5 show each a device in a schematic circuit diagram.

The next segment shows the voltage on the sense enable control signal (SE, plotted along line 712) that enables the sense amplifier 420 when set to logic high. The next segment plots the selection signal, VSSPRECEN (along line 722), which connects (via a selection circuitry 880 as shown in FIG. 4, for example) VSSPRC to ground when VSSPRECEN is at logic low and to VREF when VSSPRECEN is at logic high. The next segment plots the PRECHO control signal (along line 732) that, when at logic high, connects the odd bit line to VSSPRCO, and, when at logic low, leaves the odd bit line floating. The next segment plots the PRECHE control signal (along line 742) that, when at logic high, connects the even bit line to VSSPRCE, and, when at logic low, leaves the even bit line floating. The last segment plots the voltage on the even bit line (BLE, along line 752) and the odd bit line (BLE, along line 754).

In an exemplary implementation, the PRC signals (PRECHE/O) are set to logic high, when WL is at logic high and/or before WL is set to logic high. The PRC signals (PRECHE/O) at logic high cause the bitlines BLE/BLO to be exposed to the corresponding even/odd pre-charge signals (VSSPRCE, VSSPRCO) for charging/discharging the corresponding bit line (e.g., thereby shorting the bitlines BLE/BLO). This timing avoids to alter or loose the switching charge Qsw (e.g., remnant charge) from the memory element (e.g., as all charges are shorted together).

An exemplary implementation the PRC signals (PRECHE/O) may be provided by pulsed signals, but do not need to be pulsed.

An exemplary implementation includes to alter VSSPRECE/O, e.g., by setting the signal to ground and subsequently setting the VSSPRECE/O to CP or VREF, depending on the operation scenario as detailed above. VSSPRECE/O may be set to CP or VREF before the PRC signals (PRECHE/O) are set to logic low. This enables to set WL to logic high.

An exemplary implementation of VSSPRECEN is configured to control the PRC signals (PRECHE/O). When VSSPRECEN is at low, both PRC signals (PRECHE/O) are set to ground. When VSSPRECEN is set to logic high, the PRC signals (PRECHE/O) are set to VREF or CP, depending on the operation scenario of the sense amplifier 420.

An exemplary implementation is given in the last segment, which plots the voltage of two targeted bitlines, irrespective, which one is the even bitline or the odd bitline. One of the targeted bitlines may be at a bitline voltage representing a first memory state (e.g., a logic “1”), and the other of the targeted bitlines may be at a bitline voltage representing a second memory state (e.g., a logic “0”). When the selection signal, VSSPRECEN (along line 722) is at logic high (e.g., pulsed), both targeted bitlines will be pre-charged to CP. The reference bitlines are not shown in this plot. When WL is raised to logic high, both targeted bitlines, BL, will develop an increasing voltage due to the charge sharing, e.g., the targeted bitline 752 raising more than the targeted bitline 754.

Before the cell is selected, the even bitline BLE is kept at CP by the respective PRC switch 570*e*, e.g., to compensate the disturbance initiated by the increasing plate voltage, PLE. When the even bitline, BLE, fully charged to CP, the PRC switch 570*e* is deactivated to separate BLE from the pre-charge signal control circuitry 882, and the voltage level of the selected wordline, WL, is raised. This causes a voltage to develop on the even bitline, BLE. Setting the sense enable control signal (SE) to logic “high” causes turning on the sense amplifier (SA), e.g., latch 550. As result, the reading operation may be conducted, e.g., by sensing a voltage difference by the SA.

Pre-charging the bitline, BLE, lowers the initial voltage level of BLE, to which the charge sharing between the cell capacitance and the BL parasitic capacitance contributes. As result, the initial BL voltage is negative and a lower plate voltage is sufficient to reach the voltage swing across the memory element, which is sufficient to trigger the switching charge Qsw being provided from the memory element to the even bitline, BL.

This provides not only for the possibility to use less charge pumps generating $V_{PL}$, is also reduces the energy consumption as apparent from the following relations. When BL is grounded before $V_{PL}$ is applied to the memory element, the Energy consumption is proportional to $$0.5 \cdot V_{PL}{}^2 \cdot Ccap \qquad [1]$$

where Ccap denoted the capacitance value of the memory element. When BL is charged to CP before $V_{PL}$ is applied to the memory element, the Energy consumption is proportional to $$0.5 \cdot (V_{PL} - CP)^2 \cdot Ccap + 0.5 \cdot (CP)^2 \cdot BLcap \qquad [2]$$

where CLcap denotes the value of the BL parasitic capacitance 305 and VCP denotes the first pre-charge voltage CP. As example, the first pre-charge voltage CP may be at a value between −0.1 and −1 Volt, e.g., being −0.3 Volt.

At typical values for the BLcap and the Ccap the Energy consumption according to relation [2] is more efficient than according to relation [1]. Typical values for the BLcap and the Ccap are similar, e.g., being in the same order of magnitude, e.g., differing less than 50% from each other. For example, BLcap may be in the range of 20 Femtofarad (±20%), and Ccap may be in the range from 10-15 Femtofarad (±20%). In another example, BLcap may be in the range of 20 Femtofarad (±50%), and Ccap may be in the range of 5 Femtofarad (±20%).

FIG. 4 shows a cell operation circuit 320 of a complementary type including a latch-based sense amplifier 420 in a schematic circuit diagram 400. The sense amplifier 420 may be dual-sided, whose two complementary input nodes 320*s*, 320*r* (also referred as to reference sensing node and sensing node) are connected to the bit lines of the even/odd bit line pair, where the latch is enabled by a sense enable (SE) signal.

The even side bit line (BLE) and odd side bit line (BLO) are pre-charged through corresponding pre-charging switches 570*e*, 5700 as exemplarily switches by corresponding even/odd pre-charge signals provided by a pre-charge signal control circuitry 882. The pre-charge signals are configurable via a selection circuitry 880 of the pre-charge signal control circuitry 882. The selection circuitry 880 may be implemented by a 2×2 multiplexer or another suitable circuit, which includes two inputs (also referred as to selection inputs) and, for each PRC switch, an output (also referred as to selection output) connected to the PRC switch, e.g., two outputs. One of the selection inputs receives the first pre-charge voltage, CP, and the other of the selection inputs receives a second pre-charge voltage, VREF. The selection circuitry 880 may switch to a first state or a second state based on a selection signal, VSSPRECEN, supplied to the selection circuitry 880. In the first state (dashed lines), the selection circuitry 880 supplies the even PRC switch 570*e* with VREF and the odd PRC switch 5700 with CP. In the second state (dotted lines), the selection circuitry 880 supplies the even PRC switch 570*e* with CP and the odd PRC switch 5700 with VREF. As noted above, the pre-charge voltages (CP, VREF) contribute to compensate the offset of the read-window caused by the BL parasitic capacitance, when the plate voltage is increased.

Before a read voltage is applied to the bit line being read, one or both bit lines may be discharged to CP by selecting (e.g., based on selection signal VSSPRECEN), at the selection circuitry 880, to set VSSPRC to CP and enabling the even and odd pre-charge transistors (e.g., based on pre-charge enable signals, PRECHE and PRECHO, where one signal is for the side being read, e.g., the sensing pre-charge sensing signal, and the other signal is for the complementary side, e.g., the complementary pre-charge enable signal). After the bit line BLE is discharged to CP, a read voltage (e.g., $+V_{PL}$) is pulsed to the plate line of the memory element (e.g., on the even side of the sense amplifier 420) which applies a voltage across the even-side parasitic capacitance 605*e* of.

Figure 5:
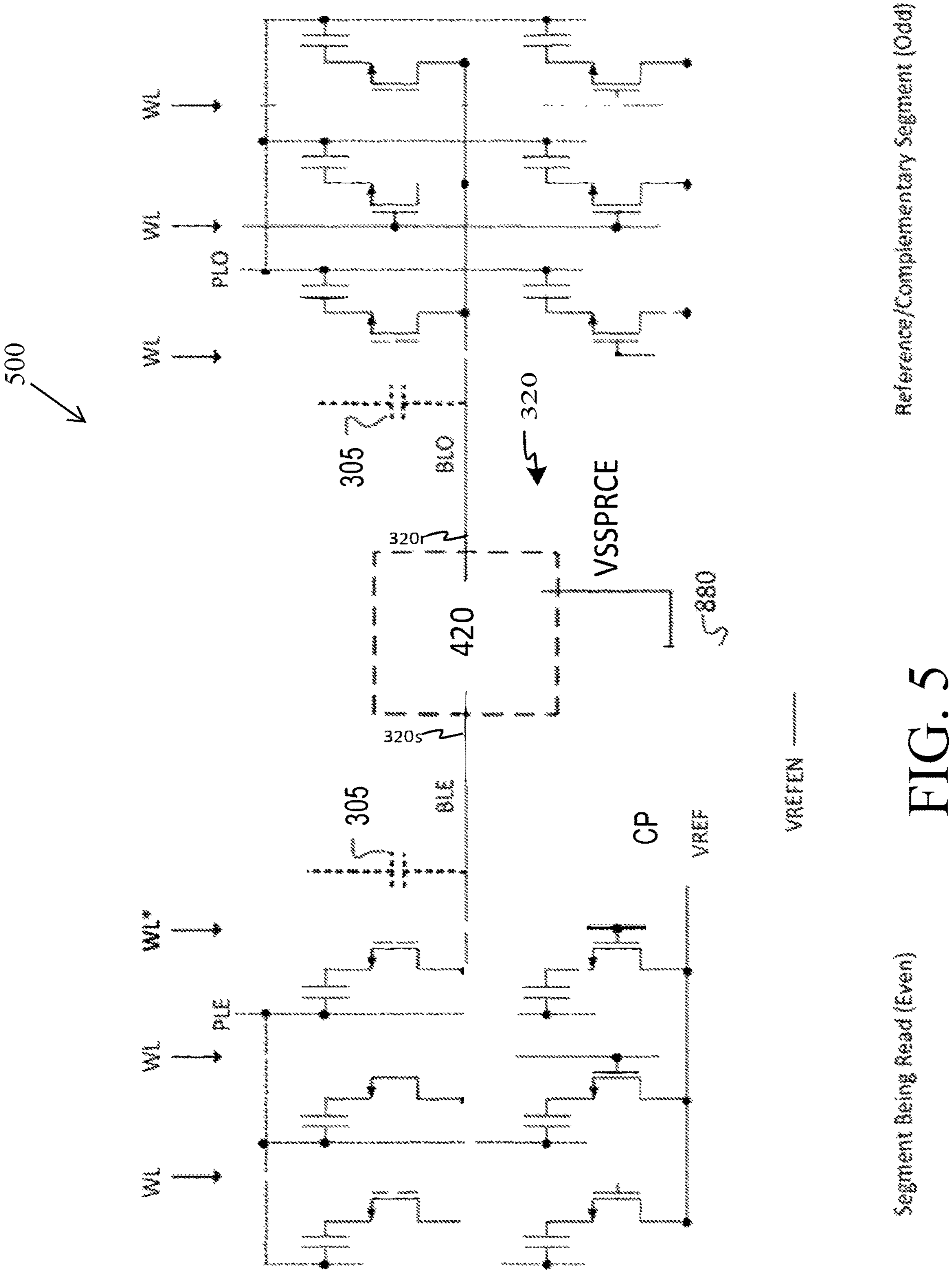

FIG. 5 shows an example 000 of the memory device including the cell operation circuit 320 and two sets of memory cells, of which one is denoted as set of even memory cells and the other is denoted as set of odd memory cells. The cell operation circuit 320 includes a sensing amplifier 420 as exemplarily sensing circuitry and the control circuitry 882 to provide the first pre-charge voltage to the even bitline, BLE.

The sense amplifier 420 is connected to one of the common even bitlines, BLE connected to the set of even memory cells and to one of the common odd bit lines, BLO, connected to the set of odd memory cells. The control circuitry 882 includes transistors or other type of switches as selection circuitry 880. Alternatively, the selection circuitry 880 may include, for each selection output one mux which selectively connects the selection output to either CP or VREF based on VSSPRECEN.

Each memory cell may include a memory element (e.g., a capacitor that is state-programmable (e.g., a ferroelectric capacitor)), where the memory elements of a given set share a plate line that is common to all of the memory cells of the set and a bit line (connectable through an access transistor) that is common to all of the memory cells of the set and connected to the sense amplifier. Word lines (WL) may connect to the gate of the access transistors (e.g., one word line per column), to select which column of the set is to be read during the read operation (e.g., which cell will be read for each bit line in the segment). In the depicted example, the word line marked with an asterisk (WL*) has been activated to select this column for reading (highlighted in bold). Also shown is the parasitic capacitance 305 that effectively exists between the each of the bit lines (BLE, BLO) and GND. As should be appreciated, each pair of even/odd bit lines (each row) may have its own sense amplifier and pre-charge signal control circuitry 882. As should also be understood, one or more components of the cell operation circuit 320 may be global in the sense that the components may connect to and/or supply multiple sense circuitries. For example, pre-charge signal control circuitry 882 may be a global pre-charge signal control circuitry 882, where VSSPRECEN controls whether VREF or CP is connected to VSSPRCE for all of the sense amplifiers in a bank (e.g., the group of sense amplifiers connected to the bit line pairs that make up the corresponding even/odd segments).

Figure 6A:
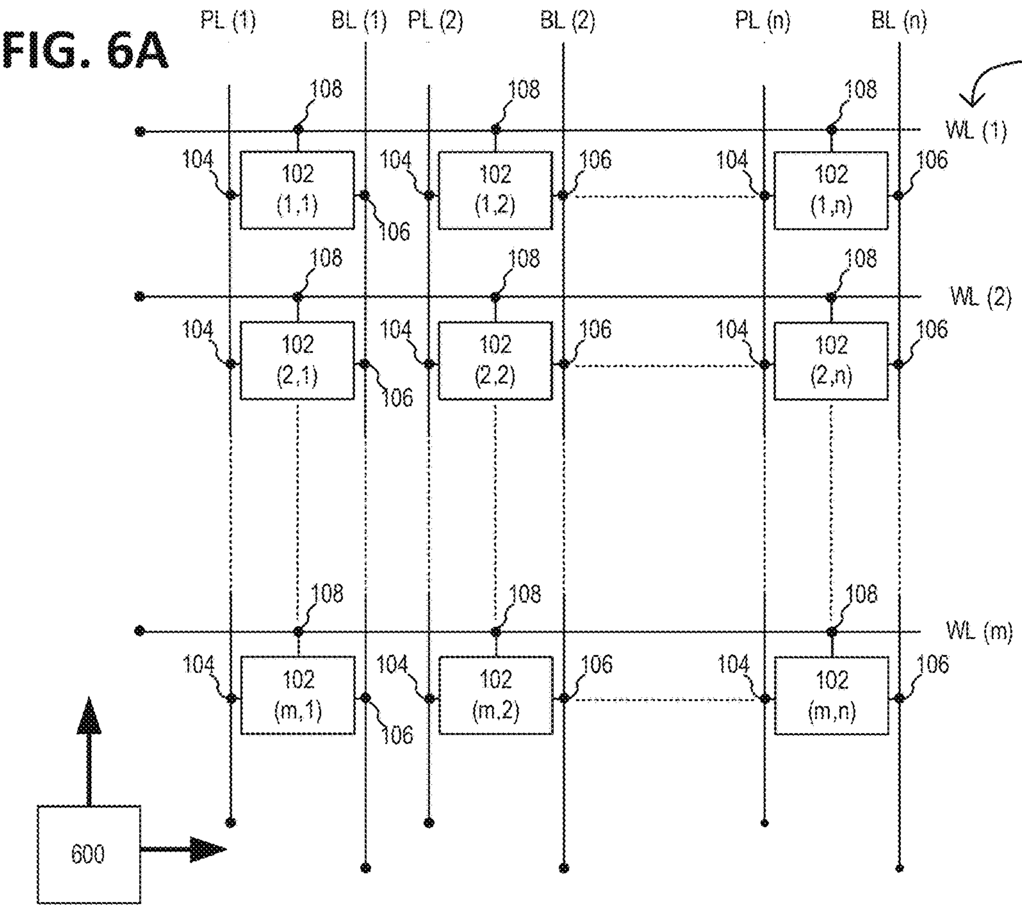
FIG. 6A an 6B show each an exemplary memory cell arrangement in a schematic diagram.
Figure 6B:
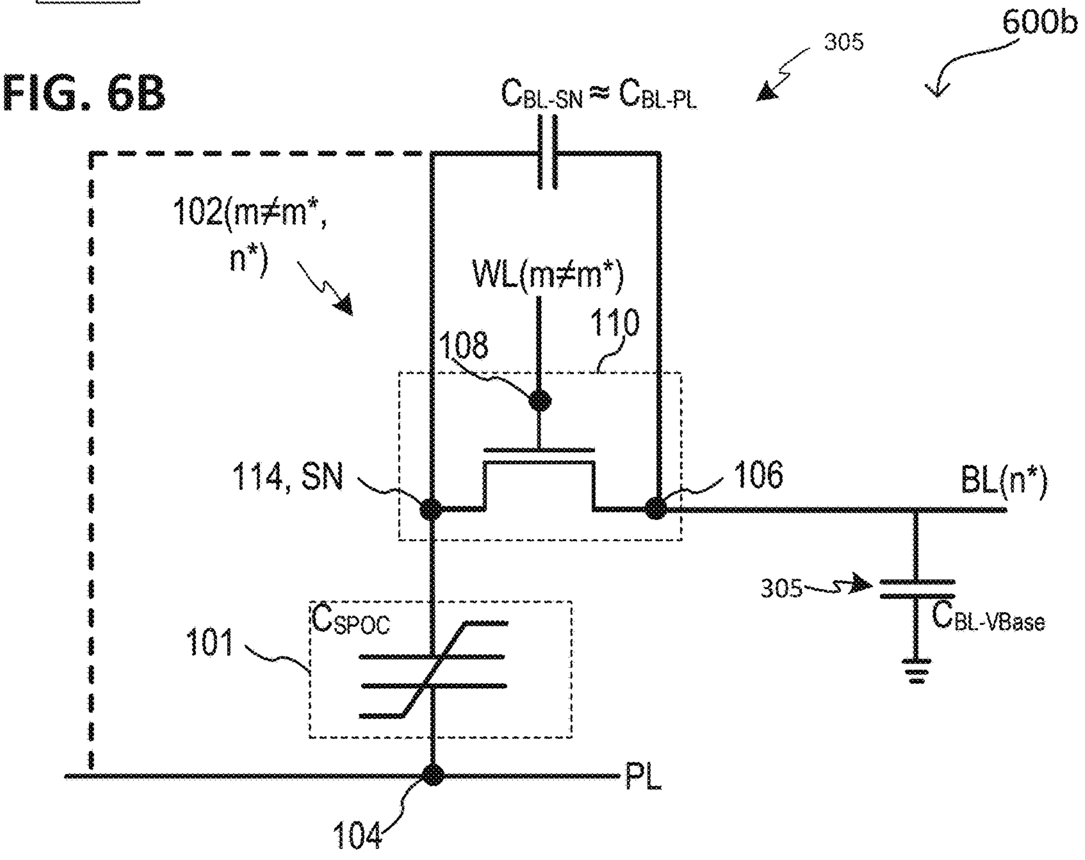

FIGS. 6A and 6B show each an exemplary memory cell arrangement 600*a* of a memory device and a detailed view 600*b* thereof, the memory cell arrangement 600*a* including a plurality of memory cells 102(*m*=1 to M, n=1 to N), of which each memory cell may be configured, for example, in analogy to memory cell 100*a*. It is understood that the memory cell arrangement 600*a* serves as an example to illustrate the aspects detailed herein and that the reference made thereto may apply in analogy to a memory device in any other suitable configuration.

A memory cell arrangement is usually configured in a matrix-type arrangement, wherein columns and rows define the addressing of the memory cells according to the control lines connecting respectively subsets of memory cells of the memory cell arrangement along the rows and columns of the matrix-type arrangement. However, other arrangements may be suitable as well. In general, a memory cell arrangement may include a plurality of (e.g., volatile or non-volatile) memory cells, which may be accessed individually or on groups via a corresponding addressing scheme. The matrix architecture may be, for example, referred to as "OR", "AND", "NOR", or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

The plurality of memory cells 102(*m*=1 to M, n=1 to N) may be arranged an array of N times M. "N" may be any integer number equal to or greater than one. "M" may be any integer number equal to or greater than one. In some aspects, the memory cell arrangement may be in a ferroelectric random-access memory (FeRAM) configuration.

The depicted architecture of memory cell arrangement 600*a* is understood as exemplary implementation for a facilitated understanding, not meant to be limiting. The referenced made hereto may apply in analogy to other architectures of a memory cell arrangement, e.g., including multiple platelines, e.g., of which the number may range from 1 to N*M depending on the chosen architecture. Examples of the number, N_PL, of platelines for implementing an architecture including m wordlines and n bitlines, may include: N_PL=1 (one plateline), N_PL=n, N_PL=m, N_PL=(m·n) or combinations thereof. The same applies to other memory cell arrangements as detailed herein in analogy.

The memory cell arrangement may include a plurality of bitlines BL(n=1 to N), at least one plateline PL, and a plurality of wordlines WL(m=1 to M) for (individually and selectively) addressing the plurality of memory cells 102 (*m*=1 to M, n=1 to N). Each memory cell 102(*m**, n*) may be connected to and selectively (and individually) addressable via a corresponding bitline BL(n*) of the plurality of bitlines BL(n=1 to N), a corresponding wordline WL(m*) of the plurality of wordlines WL(m=1 to M), and the plateline PL. The *—notation may define one specific integer for the corresponding variable, such as a specific n* for the variable n, a specific m* for the variable m, etc.

In this exemplary configuration, each memory cell 102 (*m**, n*) may be a three-terminal memory cell having a plateline terminal 104, a first access terminal 106, and a second access terminal 108. The plateline terminal 104 of a respective memory cell 102(*m**, n*) may be coupled to the corresponding plateline PL. The first access terminal 106 of the respective memory cell 102(*m**, n*) may be coupled to the corresponding bitline BL(n*). The second access terminal 108 of the respective memory cell 102(*m**, n*) may be coupled to the corresponding wordline WL(m*).

The memory device may include a controller 600 (also referred as to control device), e.g., including pre-charge signal control circuitry 882 and/or the operation control circuitry 560. The controller 600 may be configured to apply a respective voltage to each control line described herein. The controller 600 may be configured to apply the plate voltage, $V_{PL}$, (via the corresponding plateline PL) at the plateline terminal 104, a bitline voltage, $V_{BL}$, (via the corresponding bitline BL(n*)) at the first access terminal 106, and a wordline voltage, $V_{WL}$, (via the corresponding wordline WL(m*)) at the second access terminal 108 of the memory cell 102(*m**, n*) in order to address the memory cell 102(*m**, n*). The controller 600 may be configured to write a memory state (also referred as to write operation) of at least one memory cell 102(*m**, n*). The controller 600 may be configured to initiate a read-out operation to read the memory state of the at least one memory cell 102(*m**, n*).

"Writing" a memory cell, as used herein, may be understood as bringing the memory cell into one of at least two different memory states. Writing a memory cell may also be referred to as programming the memory cell, wherein the memory state the memory cell is residing in after programming may be called "programmed state". Therefore, the memory cell may also be referred to as state-programmable memory cell.

"Reading" a memory cell, as used herein, may be understood as determining the memory state the memory cell is residing in (e.g., programmed to). In general, a memory cell may be read either non-destructively (if the read-out operation does not change the memory state the memory cell is residing in) or destructively (if the read-out operation changes the memory state the memory cell is residing in). Thus, a destructive read-out operation may require a write operation subsequent to read-out in order to program again the memory state of the memory cell.

FIG. 6B shows an equivalent circuit of a non-selected memory cell of memory cell arrangement 600*a*. For those other memory cells 102(*m*=1 to M/m*, n*), there may be a parasitic bitline to storage node (SN) capacitance, $C_{BL\text{-}SN}$, due to this coupling. Since for all non-selected (also referred to as unselected or deselected) memory cells the voltage at the bitline terminal 114, which provides a storage node, SN, is close to the plateline voltage, $V_{PL}$, the parasitic bitline to storage node capacitance $C_{BL\text{-}SN}$ may be considered in the equivalent circuit as being directly connected to the plateline instead of the storage node SN (see dashed line).

Illustratively, when reading a respective memory cell 102(*m**, n*), there may be a parasitic bitline to storage node capacitance $C_{BL\text{-}SN}$ between the corresponding bitline BL(n*) and the corresponding plateline PL via one or more of the non-selected other memory cells 102 (m=1 to M/m*, n*), which are also coupled between the corresponding bitline BL(n*) and the corresponding plateline PL (see memory cells in a column in the memory cell arrangement). This case may be understood as example not limiting the underlying aspects. The coupling is generally dependent on the specific architecture, and may differ from case to case. For example for certain layouts, BL(1) may be coupled to the PL via memory cells 102(1,1), 102(1,2), 102(2,1), 102 (2,2), . . . , 102(*m*,1), 102(*m*,2).

Analogously, the specific values of M, the parasitic bitline to storage node capacitance $C_{BL\text{-}SN}$ and the capacitance of the selected memory cell may be a function of the specific architecture. For example, the parasitic bitline to storage node capacitance $C_{BL\text{-}SN}$ may be less than the capacitance of the selected memory cell even with M lower than 100. Generally said, the parasitic bitline to storage node capacitance $C_{BL\text{-}SN}$ increases with increasing M relative to the capacitance of the selected memory cell, e.g., exceeding the capacitance of the selected memory cell. In an exemplary case, the parasitic bitline to storage node capacitance $C_{BL\text{-}SN}$ may be less than the capacitance of the selected memory cell (i.e., the memory cell which is read), e.g., when M is equal to or greater than one hundred (e.g., equal to or greater than five hundred, etc.). However, the sum of the parasitic capacitances of those M−1 other memory cells 102(*m*=1 to M/m*, n*) may be even larger than the capacitance of the selected memory cell 102(*m**, n*). Further, there may be a parasitic bitline to base voltage (e.g., ground voltage) capacitance $C_{BL\text{-}VBASE}$ of the corresponding bitline BL(n*). With reference to FIG. 10B, some amount of the voltage the corresponding bitline BL(n*) is charged to during a read-out operation (i.e., part of $\Delta V_0$ or $\Delta V_1$) results from the parasitic capacitances of the non-selected memory cells 102(*m*=1 to M/m*, n*).

The parasitic voltage developed on the corresponding bitline BL(n*) due to the parasitic capacitances may reduce the switching charge provided by the state-programmable memory element during a read operation. A reduced switching charge means that the read window (e.g., the difference between the developed voltage associated with a logic "0" and the developed voltage associated with a logic "1") may be narrower and the read margin may be reduced, leading to potential read errors.

Figure 7A:
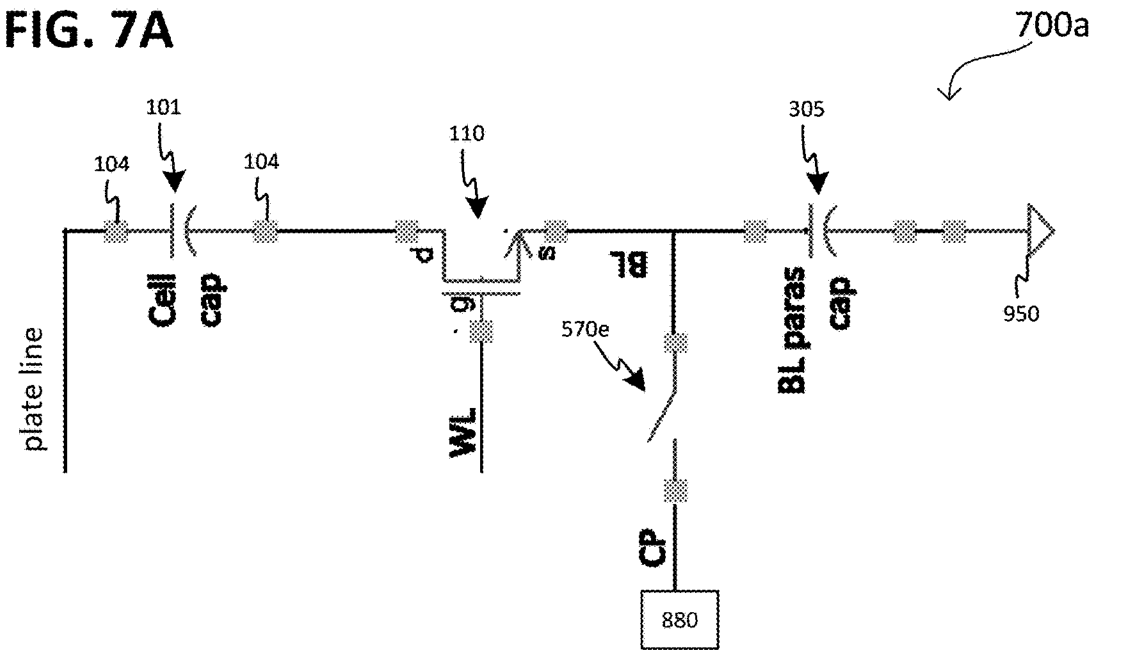
FIG. 7A a memory device in a schematic circuit diagram.

FIG. 7A shows a memory device including the memory element 101 being coupled in series with the parasitic capacitance 305 by the access switch 110 in a schematic circuit diagram. This series connection functions similar to a voltage divider, which as a consequence contributes to an increase of the voltage at BL as a function of the voltage at the plate line, thereby reducing the effective voltage, Veff, across the memory element 101.

Figure 7B:
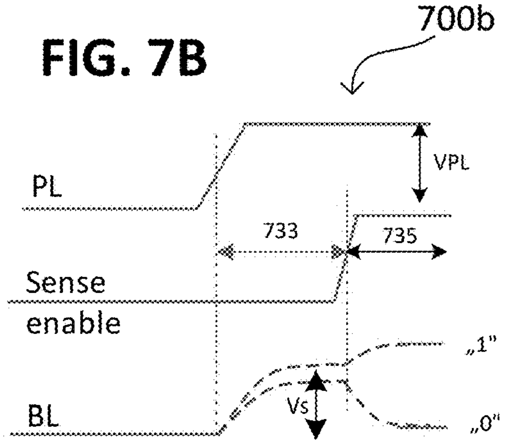
FIGS. 7B and 7C show each an operation schema in a schematic timing diagram.

FIG. 7B shows a read operation in a schematic timing diagram 700*a* for an ideal case without the BL parasitic capacitance 305. After the voltage at the plate line, PL, is increased by $V_{PL}$, the switching charge Qsw may not be developed on bitline, BL, causing a voltage swing Vs at the bitline BL arriving at a sensing voltage, which is indicative of the programmed state of the memory element 101. When the sense enable (SE) signal is activated, the sensing circuit is exposed to the supply operation voltage and the reference operation voltage, thereby developing a voltage at the sensing node which is indicative of the programmed state of the memory element 101. The voltage on the bitline (BL) is plotted for two cases, of which the upper represents a logic information of "1" (e.g., logic high) and the lower represents a logic information of "0" (e.g., logic low).

Figure 7C:
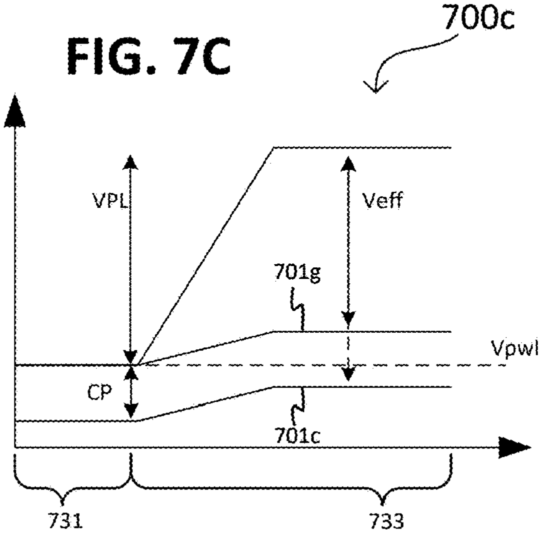

FIG. 7C shows a read operation in a schematic timing diagram 700*c* for two cases represented by lines 701*g* and 701*c*. The voltage at the plate line, PL, is increased by a total of $V_{PL}$, e.g., from Vpwl=0 to $V_{PL}$. In the first case, represented by line 701*g*, the BL is at GND when the voltage at the PL is increased. As result, the effective voltage Veff across the memory element 101 is less than $V_{PL}$-Vpwl, e.g., less than $V_{PL}$ (in case Vpwl=0). This may impair the read out, as Veff may be below the read voltage. As consequence, the switching charge Qsw may not be developed on bitline, BL, during the signal development time tD. In the second case, represented by line 701*c*, the BL is at CP when the voltage at the PL is increased. As result, the effective voltage Veff across the memory element 101 is higher than in the first case. This may facilitate the determination of the programmed state in the determination phase 735, as Veff may at or above the read voltage. As consequence, the switching charge Qsw may be developed on bitline, BL, during the development phase 733, as depicted in FIG. 0A.

Figure 7D:
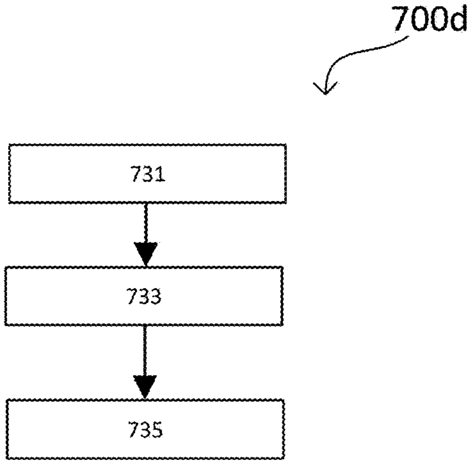
FIG. 7D a method in a schematic flow diagram.

FIG. 7D shows a method according to various aspects in a schematic flow diagram 700*d*. The method, e.g., one or more components thereof, may implement the read operation as detailed herein and/or may be implemented by one or more control circuitries.

The method may include, e.g., in phase 731 (also referred as to pre-charge phase), providing a voltage level at the sensing node (also referred as to pre-charged voltage level), which is below the reference voltage level. The voltage level may be provided by applying the first pre-charge voltage to the sensing node, e.g., at the beginning of the pre-charge phase.

The method may include, e.g., in phase 733 (also referred as to development phase), developing the voltage level at the sensing node is developed to a sensing voltage. For example, the sensing voltage may be a function of the pre-charge voltage (also referred as to compensation voltage). For example, the sensing voltage may be a function of the voltage swing (also referred to as switching voltage), which is indicative of the programmed state of the memory element and/or which is offset by the compensation voltage.

The method may include, e.g., in phase 735 (also referred as to determination phase), to determine the programmed state of the memory element based on the sensing voltage. This may comprise to provide, if the sensing voltage is above a threshold voltage, a first voltage (also referred as to first state voltage) at the sensing node and, otherwise a second voltage (also referred as to second state voltage) at the sensing node. The programmed state is associated with one of a first logic state at a first state voltage and a second logic state at a second state voltage.

In the following, various working examples are provided that may include one or more aspects described herein (e.g., with reference to a multilevel state-programable memory element). It may be intended that aspects described in relation to the circuits and components thereof may apply also to the described method(s), and vice versa.

A working example 1 addresses specific mechanisms of communication between various components of a cell operation circuit. The sensing circuitry comprises a sensing node and is configured to read from the memory element based on a voltage level (also referred as to sensing voltage) at the sensing node. The sensing circuitry is operated by multiple operation voltages applied to the sensing circuitry, of which the lower one is, as example, a reference operation voltage. A control circuitry is configured to control the voltage level supplied to the sensing node in accordance with a read operation. The read operation includes a pre-charge phase, where the voltage level of the sensing node is below the reference operation voltage, and a development phase, where the voltage level is increased to the sensing voltage. Controlling the voltage level of the sensing node in this manner contributes to the reliability of the read operation and contributes to optimizing the (e.g., power) performance of the cell operation circuit.

A working example 2 addresses specific mechanisms of communication between various components of a cell operation circuit. The sensing circuitry comprises a sensing node and is configured to read from the memory element based on a voltage level (also referred as to sensing voltage) at the sensing node. The voltage level at the sensing node is developed in response to the memory element being exposed to a voltage swing from the reference operation voltage to a reading voltage. A control circuitry is configured to control the voltage level supplied to the sensing node in accordance with a read operation. The control circuitry is further configured to control the voltage swing supplied to the memory element in accordance with the read operation. The read operation includes a pre-charge phase, where the voltage level of the sensing node is below the reference operation voltage, and a development phase, where the voltage level is increased to the sensing voltage. Controlling the voltage level of the sensing node in this manner contributes to the reliability of the read operation and contributes to optimizing the (e.g., power) performance of the cell operation circuit.

A working example 3, according to which the first pre-charge voltage is developed to the sensing node (e.g., in accordance with one of working examples 1 to 2), contributes to a reduction of the programming voltage used as reading voltage (e.g., plate voltage) for reading from the memory element. This reduction may be associated with the removal of a charge pump otherwise needed to obtain a higher voltage.

A working example 4, according to which the first pre-charge voltage is developed to the sensing node (e.g., in accordance with one of working examples 1 to 3), contributes to a reduction of the overall energy needed for reading, e.g., by splitting the total voltage in two lower voltages, one positive programming voltage and one negative pre-charge voltage (e.g., CP).

A working example 5, according to which the first pre-charge voltage is developed to the sensing node (e.g., in accordance with one of working examples 1 to 4), contributes to a reduction of the reference voltage needed to discriminate ones and zeros, as all distributions are shifted to a lower voltage. This is also associated to a power reduction, since the reference BL (e.g., BLO) represents a significant load in the read operation.

A working example 6, according to which the first pre-charge voltage is developed to the sensing node (e.g., in accordance with one of working examples 1 to 5), includes developing the plate line to the programming voltage, while the word line is grounded; discharging the bit from GND to CP=−300 mV, while the word line is deactivated; disconnect CP from the bit line (making it floated); activate the word line, e.g., when the bit line is separated from CP.

In the following, various examples are provided that may include one or more aspects described above, e.g., with reference to a multilevel state-programable memory element. It may be intended that aspects described in relation to the circuits and components thereof may apply also to the described method(s), and vice versa.

Example 1 (e.g., a cell operation circuit for sensing a programmed state of a memory element) is configured in accordance with one of the accompanying claims and/or includes: a sensing circuitry comprising a sensing node, a first input terminal to receive a first operation voltage and a second input terminal to receive a second operation voltage less than the first operation voltage (e.g., a reference operation voltage); a first switch (also referred as to first pre-charge control switch) configured to apply a first pre-charge voltage less than the second operation voltage to the sensing node; wherein, preferably, the sensing circuitry is configured to read (e.g., to sense the programmed state) from the memory element based on a sensing voltage, which is developed at the sensing node (e.g., via a word line), e.g., based on the first pre-charge voltage.

Example 2 (e.g., a cell operation circuit for sensing a programmed state of a memory element) is configured in accordance with one of the accompanying claims and/or includes: a sensing circuitry comprising a sensing node; a first switch (also referred as to first pre-charge control switch) configured to discharge the sensing node from the second operation voltage to a first pre-charge voltage; wherein the sensing circuitry is configured to read from the memory element based on a sensing voltage, which is developed at the sensing node (e.g., via a word line), e.g., based on the first pre-charge voltage.

Example 3 (e.g., a cell operation circuit for sensing a programmed state of a memory element) is configured in accordance with one of the accompanying claims and/or includes: a control circuitry configured to increase a voltage (to which the memory element is exposed and/or at a terminal of the memory element, also referred as to plateline terminal) from the second operation voltage (e.g., a voltage level thereof) by (e.g., to or above) a programming voltage (e.g., a value thereof) of the memory element; a sensing circuitry configured to read from the memory element based on a sensing voltage, which is developed at a sensing node of the sensing circuitry (e.g., based on a first pre-charge voltage); a first switch configured to apply a first pre-charge voltage less than the reference operation voltage to the sensing node. The second operation voltage may, for example, be the reference operation voltage.

Example 4 (e.g., a cell operation circuit for sensing a programmed state of a memory element) is configured in accordance with one of examples 1 to 3 and/or includes: a sensing circuitry configured to read from the memory element based on a sensing voltage, which is developed at the sensing node of the sensing circuitry (e.g., based a first pre-charge voltage); a control circuitry configured to control a coupling (e.g., via a access switch) of the sensing node to the memory element (e.g., via a word line) and to apply the first pre-charge voltage to the sensing node before the sensing node is coupled to the memory element.

Example 5 (e.g., a cell operation circuit for sensing a programmed state of a memory element) is configured in accordance with one of examples 1 to 4 and/or includes: a sensing circuitry comprising a sensing node and being configured to read from the memory element based on a sensing voltage at the sensing node and based on multiple operation voltages applied to the sensing circuitry; a control circuitry configured to control a voltage level supplied to the sensing node in accordance with a read operation, wherein read operation comprises: a first phase (e.g., pre-charge phase), in which the voltage level is below each of the multiple operation voltages; and a second phase (e.g., development phase), in which the voltage level is developed to the sensing voltage.

Example 6 (e.g., a method for sensing a programmed state of a memory element) is configured in accordance with one of examples 1 to 5 and/or includes: providing a voltage level, which is below a reference operation voltage, at a sensing node of a sensing circuitry, wherein the sensing circuitry is configured to read from the memory element based on a sensing voltage at the sensing node; providing the reference operation voltage to the sensing circuitry and/or to the memory element.

Example 7 (e.g., a method for sensing a programmed state of a memory element) is configured in accordance with one of examples 1 to 6 and/or includes: setting a bit line, to which the memory element is connected (e.g., via an access switch) to a first pre-charge voltage; developing, e.g., based on the first pre-charge voltage, at the bit line sensing voltage different from the first pre-charge voltage.

Example 8 is configured in accordance with one of examples 1 to 7, wherein the memory element is configured to develop the sensing voltage at the sensing node in response to being exposed to a voltage swing from the reference operation voltage to a programming voltage (e.g., a read voltage).

Example 9 is configured in accordance with one of examples 1 to 8, wherein the sensing circuitry is configured to determine the programmed state of the memory element in response to being supplied by (e.g., a first input terminal of the sensing circuitry) a first operation voltage and (e.g., at a second input terminal of the sensing circuitry) a second operation voltage less than the first operation voltage (e.g., the reference operation voltage).

Example 10 is configured in accordance with one of examples 1 to 9, wherein the control circuitry comprises one or more switches, e.g., the first pre-charge control switch, the second pre-charge control switch and/or the access switch.

Example 11 is configured in accordance with one of examples 1 to 10, wherein the first pre-charge voltage is configured to compensate for a parasitic capacitance across the memory element.

Example 12 is configured in accordance with one of examples 1 to 11, wherein the programmed state is associated with one of a first logic state at a first voltage and a second logic state at a second voltage, wherein the sensing circuitry is configured to provide, if the sensing voltage is above a threshold voltage, the first voltage at the sensing node and, if the sensing voltage is at or below the threshold voltage, the second voltage at the sensing node to determine the programmed state.

Example 13 is configured in accordance with one of examples 1 to 12, wherein the sensing circuitry comprises a latch, wherein a first side of the latch is connected to the sensing node, wherein a complementary second side of the latch is connected to a reference node of the sensing circuitry.

Example 14 is configured in accordance with one of examples 1 to 13, wherein the sensing circuitry comprises a reference node (also referred as to reference sensing node) and is configured to determine a programmed state of the memory element further based on a reference voltage at the reference sensing node.

Example 15 is configured in accordance with one of examples 1 to 14, further comprising a second switch configured to apply the first and/or a second pre-charge voltages (e.g., different from the first pre-charge voltage, e.g., more than the pre-charge voltage) to the reference sensing node, wherein, preferably, the second pre-charge voltage is more than the second operation voltage and/or less than the first operation voltage.

Example 16 is configured in accordance with one of examples 1 to 15, further comprising a voltage control circuitry configured to control a first voltage level supplied to the first switch (e.g., in accordance with a read operation), wherein the first voltage level is the first pre-charge voltage in a first phase of the read operation and a second pre-charge voltage in a second phase of the read operation.

Example 17 is configured in accordance with one of examples 1 to 16, wherein the voltage control circuitry configured to control a second voltage level supplied to the second switch in accordance with the read operation, wherein the second voltage level is the second pre-charge voltage in the first phase of the read operation and the first pre-charge voltage in a further first phase of the read operation.

Example 18 is configured in accordance with one of examples 1 to 17, further comprising a first voltage source (e.g., charge pump) configured to provide (e.g., based on the first and/or second operation voltages) one or more pre-charge voltages comprising the first pre-charge voltage and/or the second pre-charge voltage, wherein the first voltage source is preferably coupled to the voltage control circuitry.

Example 19 is configured in accordance with one of examples 1 to 18, further comprising a second voltage source (e.g., charge pump) configured to provide the second operation voltage and/or the programming voltage (e.g., read voltage), wherein the second voltage source is preferably coupled to the voltage control circuitry.

Example 20 is configured in accordance with one of examples 1 to 19, wherein the second operation voltage is a reference voltage (e.g., ground) or differs from the reference voltage less than the first operation voltage.

Example 21 is configured in accordance with one of examples 1 to 20, wherein the sensing circuitry is configured as sense amplifier.

Example 22 is configured in accordance with one of examples 1 to 21, wherein the sensing voltage is developed at the sensing node (e.g., via a word line) further based on a switching voltage indicative of the programmed state of the memory element.

Example 23 is configured in accordance with one of examples 1 to 22, wherein to read from the memory element comprises to determine a programmed state of the memory element based on a sensing voltage, which is developed at the sensing node (e.g., via a word line)) based on a switching voltage indicative of the programmed state of the memory element and based on the first pre-charge voltage.

Example 24 is configured in accordance with one of examples 1 to 23, further comprising a control circuitry configured to control (e.g., via a access switch) a coupling of the sensing node to the memory element (e.g., via a word line) and/or to apply (e.g., via the first switch) the first pre-charge voltage to the sensing node, e.g., before the sensing node is coupled to the memory element.

Example 25 is configured in accordance with one of examples 1 to 24, wherein the sensing node is coupled to the memory element, when the sensing node is (e.g., galvanically) separated from first pre-charge voltage (e.g., via the first switch).

Example 26 is configured in accordance with one of examples 1 to 25, wherein each switch is provided by one or more transistors.

Example 27 is configured in accordance with one of examples 1 to 26, further comprising a control circuitry configured to increase a voltage at a terminal of the memory element (also referred as to plateline terminal) from a reference operation voltage (e.g., a voltage level thereof) by (e.g., to or above) a programming voltage (e.g., a value thereof) of the memory element.

Example 28 is (e.g., a memory device) is configured in accordance with one of the accompanying claims and/or includes: the cell operation circuit of one of one of examples 1 to 27, and the memory element coupled to the sensing node (e.g., via a first terminal of the memory element and/or via an access switch).

Example 29 is configured in accordance with one of examples 1 to 28, wherein the memory element preferably comprises a second terminal (e.g., plateline terminal) to receive a programming voltage, e.g., a read voltage (e.g., plate voltage).

Example 30 is configured in accordance with one of examples 1 to 29, wherein a difference between the first operation voltage and the second operation voltage is more than about 1 Volt (e.g., about 3 Volt) and/or less than about 20 Volt, e.g., 10 Volt.

Example 31 is configured according to one of one of examples 1 to 30, wherein a difference between the first operation voltage and the second operation voltage is more than a difference between the second operation voltage and the first pre-charge voltage.

Example 32 is configured according to one of one of examples 1 to 31, wherein a difference between the first operation voltage and first pre-charge voltage is more than a difference between the first operation voltage and the second operation voltage.

Example 33 is configured according to one of one of examples 1 to 32, wherein the memory element is exposed to the voltage swing when the sensing node is (e.g., galvanically) separated from first pre-charge voltage (e.g., via the first switch).

Example 34 is configured according to one of one of examples 1 to 33, wherein the memory element includes a ferroelectric capacitor, wherein the programmed state includes preferably a remanent polarization state of the ferroelectric capacitor.

Example 35 is configured according to one of one of examples 1 to 34, wherein the sensing node includes or adjoins a bit line (e.g., BLE), for example, the bit line coupled to each of a first set of memory cells).

Example 36 is configured according to one of one of examples 1 to 35, wherein the reference sensing node includes or adjoins a further bit line (e.g., BLO), for example, the further bit line coupled to each of a second set of memory cells different from the first set.

Example 37 (e.g., a method for reading a programmed state of a memory element) is configured according to one of one of examples 1 to 36 and/or includes:

Example 38 is configured according to one of one of examples 1 to 37, including developing a sensing voltage to the bit line modified by the first pre-charge voltage and based on a switching voltage provided by the memory element.

Example 39 is configured according to one of one of examples 1 to 38, including determining the programmed state based on the sensing voltage.

Example 40 is configured according to one of one of examples 1 to 39, wherein the first pre-charge is developed to the bit line by controlling the first switch.

Example 41 is configured according to one of one of examples 1 to 40, wherein the cell operation circuit provides an electronic circuit configured to sense and control various voltages for operating a memory element.

Example 42 is configured according to one of one of examples 1 to 41, wherein the memory element provides multiple remanent states as programmed states.

Example 43 is configured according to one of one of examples 1 to 42, wherein the sensing circuitry is configured to sense a voltage level at the sensing node and/or convert (e.g., amplify) the voltage level at the sensing node into an output voltage indicative of the programmed state of the memory element.

Example 44 is configured according to one of one of examples 1 to 43, wherein the sensing node include an electric conductor (e.g., being metallic), e.g., providing an electrically conductive line.

Example 45 is configured according to one of one of examples 1 to 44, wherein the first operation voltage (e.g., Vpwr) is a "high" operation voltage and the second operation voltage (e.g., Vpwl) is a "low" operation voltage Example 46 is configured according to one of one of examples 1 to 45, wherein the first operation voltage is supplied to the sensing circuitry and/or to the memory element.

Example 47 is configured according to one of one of examples 1 to 46, wherein the second operation voltage is supplied to the sensing circuitry and/or to the memory element.

Example 48 is configured according to one of one of examples 1 to 47, wherein a voltage level of the word line is increased after the sensing node is (e.g., galvanically) separated from the first reference voltage.

Example 49 is configured according to one of one of examples 1 to 48, wherein the latch is coupled between the first input terminal and the second input terminal.

Example 50 is configured according to one of one of examples 1 to 49, wherein the second operation voltage differs more from the first operation voltage than from the pre-charge voltage.

Example 51 is configured according to one of one of examples 1 to 50, wherein the sensing circuitry is configured to provide, if the sensing voltage is above the threshold voltage, the first voltage at the sensing node and, if the sensing voltage is at or below the threshold voltage, the second voltage at the sensing node, e.g., based on the sensing voltage and/or in response to receiving the first operation voltage at the first input terminal and the second operation voltage at the second input terminal.

Example 52 is configured according to one of one of examples 1 to 51, wherein the second operation voltage differs from electrical ground less than the pre-charge voltage Example 53 is configured according to one of one of examples 1 to 52, wherein the memory element is exposed to the voltage swing and/or to the programming voltage, when the sensing node is at the first pre-charge voltage.

Example 54 is configured according to one of one of examples 1 to 53, wherein the sensing node is discharged from the second operation voltage to the pre-charge voltage, e.g., by the first switch.

Example 55 is configured according to one of one of examples 1 to 54, wherein the first pre-charge voltage is less than GND.

Example 56 is configured according to one of one of examples 1 to 55, wherein the first pre-charge voltage is less than the second operation voltage (e.g., GND), e.g., by a minimum of 0.1 Volts, e.g., by a minimum of 0.2 Volts, e.g., by a minimum of 0.3 Volts.

Example 57 is configured according to one of one of examples 1 to 56, wherein the first pre-charge voltage is less than the second operation voltage (e.g., GND), e.g., by a maximum of 50 Volts, e.g., by a maximum of 20 Volts, e.g., by a maximum of 10 Volts, e.g., by a maximum of 1 Volt.

Example 58 is configured according to one of one of examples 1 to 57, wherein the first pre-charge voltage (e.g., CP) is lower than the second operation voltage (e.g., reference operation voltage).

Example 59 is configured according to one of one of examples 1 to 58, wherein cell operation circuit allows for accurate reading of the memory element's state by using a pre-charge voltage to stabilize the sensing node. This approach helps in reducing errors caused by parasitic coupling and ensures reliable operation of the memory device. The use of different operation voltages and a pre-charge mechanism enhances the precision and efficiency of the read operations.

Example 60 is configured according to one of one of examples 1 to 59, wherein the control circuitry is configured to increase a voltage level, to which the memory element is exposed, from a reference operation voltage by a swing defined by a programming voltage of the memory element.

Example 61 is configured according to one of one of examples 1 to 60, wherein the control circuitry is configured to increase voltage level, to which the memory element is exposed, to initiate that a sensing voltage is developed at the sensing node.

Example 62 is configured according to one of one of examples 1 to 61, wherein the control circuitry is configured to apply a voltage swing the memory element from a reference operation voltage, wherein the swing is defined by a programming voltage of the memory element.

Example 63 is configured according to one of one of examples 1 to 62, wherein the first pre-charge voltage contributes to mitigating the effects of parasitic coupling, which can cause erroneous readings by influencing the voltage levels in the circuit.

Example 64 is configured according to one of one of examples 1 to 63, wherein the sensing voltage is developed (e.g., at a sensing node) in response to the memory element being exposed to the programming voltage and/or when the voltage, to which the memory element is exposed, is increased by the programming voltage.

Example 65 is configured according to one of one of examples 1 to 64, wherein a reference sensing node of the cell operation circuit is exposed to the first pre-charge voltage, e.g., when the sensing node is exposed to the first pre-charge voltage.

Example 66 is configured according to one of one of examples 1 to 65, wherein a reference sensing node of the cell operation circuit is exposed to the second pre-charge voltage, e.g., when the sensing node is exposed to the second pre-charge voltage.

Example 67 is configured according to one of one of examples 1 to 66, wherein to read from the memory element includes sensing the programmed state of the memory element.

The terms "at least one" and "one or more" may be understood to include any integer number greater than or equal to one, i.e. one, two, three, four, [ . . . ], etc. is the term "a plurality" or "a multiplicity" may be understood to include any integer number greater than or equal to two, i.e. two, three, four, five, [ . . . ], etc. is the phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device.

Each voltage, as detailed herein, may be, in analogy, expressed as voltage level, e.g., relative to a reference voltage, e.g., the reference operation voltage. The references made herein may apply to voltages and voltage levels in analogy.

While the invention has been particularly shown and described with reference to specific aspects, it should be understood by those skilled in the art that various changes in form and detail may be made therein without departing from the spirit and scope of the invention as defined by the appended examples. The scope of the invention is thus indicated by the appended examples and all changes, which come within the meaning and range of equivalency of the examples, are therefore intended to be embraced.

What is claimed is:

1. A cell operation circuit for sensing a programmed state of a memory element, the cell operation circuit comprising:

a sensing circuitry comprising a sensing node, a first input terminal to receive a first operation voltage and a second input terminal to receive a second operation voltage less than the first operation voltage;

a first switch configured to apply a pre-charge voltage less than the second operation voltage to the sensing node;

wherein the sensing circuitry is configured to sense the programmed state based on a sensing voltage, which is developed at the sensing node based on the pre-charge voltage.

2. The cell operation circuit of claim 1, wherein the pre-charge voltage is configured to compensate for a parasitic capacitance across the memory element.

3. The cell operation circuit of claim 1, further comprising a control circuitry configured to increase a voltage, to which the memory element is exposed, from the second operation voltage by a programming voltage of the memory element.

4. The cell operation circuit of claim 1, wherein the programmed state is associated with one of a first logic state at a first voltage and a second logic state at a second voltage, wherein the sensing circuitry is configured to provide, in response to receiving the first operation voltage at the first input terminal and the second operation voltage at the second input terminal and based on the sensing voltage, the first voltage at the sensing node, if the sensing voltage is above a threshold voltage, and, if the sensing voltage is at or below the threshold voltage, the second voltage at the sensing node to determine the programmed state.

5. The cell operation circuit of claim 1, wherein the sensing circuitry comprises a latch, wherein a first side of the latch is connected to the sensing node, wherein a second side of the latch is connected to a reference node of the sensing circuitry.

6. The cell operation circuit of claim 5, wherein the first input terminal is coupled to the second input terminal via the latch.

7. The cell operation circuit of claim 5, wherein the reference node is exposed to the pre-charge voltage, when the sensing node is exposed to the pre-charge voltage.

8. The cell operation circuit of claim 1, further comprising a voltage control circuitry configured to control a voltage level supplied to the first switch in accordance with a read operation, wherein the voltage level is the pre-charge voltage in a first phase of the read operation and a further pre-charge voltage in a second phase of the read operation.

9. The cell operation circuit of claim 8, further comprising a voltage source configured to provide the first pre-charge voltage based on the first and/or the second operation voltages, wherein the voltage source is coupled to the voltage control circuitry.

10. The cell operation circuit of claim 1, wherein the second operation voltage is electrical ground or differs from electrical ground less than the pre-charge voltage.

11. The cell operation circuit of claim 1, wherein the sensing circuitry is configured as sense amplifier.

12. The cell operation circuit of claim 1, wherein the sensing voltage is developed at the sensing node based on a switching voltage indicative of the programmed state of the memory element.

13. The cell operation circuit of claim 1, further comprising a control circuitry configured to control a coupling of the sensing node to the memory element and to control the first switch such that the pre-charge voltage is applied to the sensing node before the sensing node is coupled to the memory element.

14. The cell operation circuit of claim 13, wherein the sensing node is coupled to the memory element, when the sensing node is galvanically separated from the pre-charge voltage.

15. The cell operation circuit of claim 1, wherein the pre-charge voltage differs from the second operation voltage by a value ranging from about 0.1 Volts to about 1 Volt.

16. The cell operation circuit of claim 1, wherein the first switch is configured to discharge the sensing node from the second operation voltage to the pre-charge voltage.

17. The cell operation circuit of claim 1, wherein the second operation voltage differs more from the first operation voltage than from the pre-charge voltage.

18. The cell operation circuit of claim 1, wherein the first memory element includes a ferroelectric capacitor.

19. A cell operation circuit for sensing a programmed state of a memory element, the cell operation circuit comprising:

a control circuitry configured to increase a voltage level, to which the memory element is exposed, from a reference operation voltage by a programming voltage of the memory element;

a sensing circuitry configured to sense the programmed state based on a sensing voltage, which is developed at a sensing node of the sensing circuitry; and a first switch configured to apply a pre-charge voltage less than the reference operation voltage to the sensing node.

20. A cell operation circuit for sensing a programmed state of a memory element, the cell operation circuit comprising:

a sensing circuitry configured to sense the programmed state based on a sensing voltage, which is developed at a sensing node of the sensing circuitry;

a control circuitry configured to control a coupling of the sensing node to the memory element and to apply a pre-charge voltage to the sensing node before the sensing node is coupled to the memory element, wherein the sensing node is coupled to the memory element, when the sensing node is galvanically separated from pre-charge voltage.

* * * * *